US011282715B2

(12) United States Patent
Falster et al.

(10) Patent No.: US 11,282,715 B2
(45) Date of Patent: Mar. 22, 2022

(54) APPARATUS FOR STRESSING SEMICONDUCTOR SUBSTRATES

(71) Applicant: GlobalWafers Co., Ltd, Hsinchu (TW)

(72) Inventors: Robert J. Falster, London (GB);
Vladimir V. Voronkov, Merano (IT);
John A. Pitney, O'Fallon, MO (US);
Peter D. Albrecht, O'Fallon, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/437,996

(22) Filed: Jun. 11, 2019

(65) Prior Publication Data

US 2019/0295853 A1    Sep. 26, 2019

Related U.S. Application Data

(62) Division of application No. 14/142,559, filed on Dec. 27, 2013, now Pat. No. 10,361,097.

(60) Provisional application No. 61/793,999, filed on Mar. 15, 2013, provisional application No. 61/788,744, filed on Mar. 15, 2013, provisional application No. 61/790,445, filed on Mar. 15, 2013, provisional application No. 61/747,613, filed on Dec. 31, 2012.

(51) Int. Cl.
| | | |
|---|---|---|
| H01L 21/32 | (2006.01) | |
| H01L 21/683 | (2006.01) | |
| H01L 21/67 | (2006.01) | |
| H01L 21/302 | (2006.01) | |
| H01L 21/687 | (2006.01) | |
| C30B 25/12 | (2006.01) | |
| H01L 21/322 | (2006.01) | |

(52) U.S. Cl.
CPC ............ *H01L 21/322* (2013.01); *C30B 25/12* (2013.01); *H01L 21/302* (2013.01); *H01L 21/67092* (2013.01); *H01L 21/6838* (2013.01); *H01L 21/6875* (2013.01); *H01L 21/68735* (2013.01)

(58) Field of Classification Search
None
See application file for complete search history.

(56) References Cited

U.S. PATENT DOCUMENTS

| | | |
|---|---|---|
| 4,391,511 A | 7/1983 | Akiyama et al. |
| 4,473,455 A | 9/1984 | Dean et al. |
| 4,542,298 A | 9/1985 | Holden |
| 4,704,886 A | 11/1987 | Evert et al. |
| 4,842,683 A | 6/1989 | Cheng et al. |

(Continued)

FOREIGN PATENT DOCUMENTS

| | | |
|---|---|---|
| CN | 101203943 A | 6/2008 |
| DE | 19802977 A1 | 7/1999 |

(Continued)

OTHER PUBLICATIONS

Leroy et al., "Warpage of Silicon," J. Electrochemical Society, 127(4): 961-970 (1980).

(Continued)

*Primary Examiner* — Parviz Hassanzadeh
*Assistant Examiner* — Tiffany Z Nuckols
(74) *Attorney, Agent, or Firm* — Armstrong Teasdale LLP

(57) ABSTRACT

Apparatus for use in preparing heterostructures having a reduced concentration of defects including apparatus for stressing semiconductor substrates to allow them to conform to a crystal having a different crystal lattice constant.

10 Claims, 34 Drawing Sheets

(56) References Cited

U.S. PATENT DOCUMENTS

| | | |
|---|---|---|
| 5,096,536 A | 3/1992 | Cathey, Jr. |
| 5,310,453 A | 5/1994 | Fukasawa et al. |
| 5,324,410 A | 6/1994 | Kummer et al. |
| 5,326,725 A | 7/1994 | Sherstinsky et al. |
| 5,343,012 A | 8/1994 | Hardy et al. |
| 5,618,759 A | 4/1997 | Boysel |
| 5,695,566 A | 12/1997 | Suzuki et al. |
| 5,725,728 A | 3/1998 | Fuke et al. |
| 5,820,367 A | 10/1998 | Osawa |
| 5,820,650 A | 10/1998 | Yamazaki |
| 5,936,829 A | 8/1999 | Moslehi |
| 5,997,651 A | 12/1999 | Matsuse et al. |
| 6,024,828 A | 2/2000 | Hwang et al. |
| 6,168,659 B1 | 1/2001 | Yuri et al. |
| 6,171,437 B1 | 1/2001 | Shimizu et al. |
| 6,189,591 B1 | 2/2001 | Ariye et al. |
| 6,277,198 B1 | 8/2001 | Yao et al. |
| 6,392,240 B1 | 5/2002 | Aizaki |
| 6,464,780 B1 | 10/2002 | Manti et al. |
| 6,494,769 B1 | 12/2002 | Sinclair et al. |
| 6,513,848 B1 | 2/2003 | Shendon et al. |
| 6,726,537 B1 | 4/2004 | Crevasse et al. |
| 6,743,495 B2 | 6/2004 | Vasat et al. |
| 6,863,769 B2 | 3/2005 | Birner et al. |
| 6,881,632 B2 | 4/2005 | Fitzgerald et al. |
| 7,186,628 B2 | 3/2007 | Nakano |
| 7,223,320 B2 | 5/2007 | Arneson et al. |
| 7,232,591 B2 | 6/2007 | Okumura et al. |
| 7,288,492 B2 | 10/2007 | Gardecki et al. |
| 7,416,965 B2 | 8/2008 | Mantl et al. |
| 7,432,476 B2 | 10/2008 | Morita et al. |
| 7,550,309 B2 | 6/2009 | Yokokawa et al. |
| 7,642,179 B2 | 1/2010 | Ikeda et al. |
| 7,732,301 B1 | 6/2010 | Pinnington et al. |
| 7,855,127 B2 | 12/2010 | Akiyama et al. |
| 7,994,595 B2 | 8/2011 | Forbes et al. |
| 8,772,128 B2 | 7/2014 | Yamazaki et al. |
| 9,224,904 B1 | 12/2015 | Kumar et al. |
| 9,230,862 B2 | 1/2016 | Yano |
| 9,583,363 B2 | 2/2017 | Falster et al. |
| 9,583,364 B2 | 2/2017 | Falster et al. |
| 10,361,097 B2 | 7/2019 | Falster et al. |
| 2001/0010309 A1* | 8/2001 | Van Bilsen ....... H01L 21/67115 219/497 |
| 2002/0023590 A1 | 2/2002 | Storbeck |
| 2002/0029748 A1* | 3/2002 | Kuwada ............ C23C 16/45572 118/724 |
| 2002/0062785 A1 | 5/2002 | Kim et al. |
| 2002/0127956 A1* | 9/2002 | Ashjaee ............. H01L 21/6838 451/54 |
| 2003/0029610 A1 | 2/2003 | Moslehi |
| 2003/0070915 A1 | 4/2003 | Kao |
| 2003/0209326 A1 | 11/2003 | Lee et al. |
| 2004/0097025 A1 | 5/2004 | Fitzgerald et al. |
| 2004/0160582 A1 | 8/2004 | Lof et al. |
| 2004/0234696 A1* | 11/2004 | Hongo ............. H01L 21/76874 427/328 |
| 2005/0183669 A1 | 8/2005 | Parkhe et al. |
| 2006/0005911 A1 | 1/2006 | Kubo et al. |
| 2006/0035447 A1 | 2/2006 | Ikeda et al. |
| 2006/0091377 A1 | 5/2006 | Boyd et al. |
| 2006/0211221 A1 | 9/2006 | Mantl et al. |
| 2006/0228897 A1 | 10/2006 | Timans |
| 2006/0292822 A1 | 12/2006 | Xie |
| 2007/0049020 A1 | 3/2007 | Huang et al. |
| 2007/0125473 A1 | 6/2007 | Chen et al. |
| 2007/0164073 A1 | 7/2007 | Watanabe et al. |
| 2008/0194078 A1 | 8/2008 | Akiyama et al. |
| 2010/0032096 A1 | 2/2010 | Yu et al. |
| 2010/0048001 A1 | 2/2010 | Harikai et al. |
| 2010/0129990 A1 | 5/2010 | Nishizawa et al. |
| 2010/0227455 A1 | 9/2010 | Fujikawa et al. |
| 2010/0261341 A1 | 10/2010 | Takaishi et al. |
| 2011/0214809 A1 | 9/2011 | Sugiyama |
| 2011/0318489 A1 | 12/2011 | Ishizu et al. |
| 2012/0139192 A1 | 6/2012 | Ooi |
| 2012/0269498 A1 | 10/2012 | Kang et al. |
| 2012/0279257 A1 | 11/2012 | Dannoux et al. |
| 2014/0038418 A1 | 2/2014 | Bailey et al. |
| 2014/0072774 A1 | 3/2014 | Kito et al. |
| 2014/0182788 A1 | 7/2014 | Falster et al. |
| 2014/0187022 A1 | 7/2014 | Falster et al. |
| 2014/0187023 A1 | 7/2014 | Falster et al. |
| 2014/0339672 A1 | 11/2014 | Yano |
| 2016/0170312 A1 | 6/2016 | Shibazaki |

FOREIGN PATENT DOCUMENTS

| | | |
|---|---|---|
| EP | 1184894 A1 | 3/2002 |
| EP | 1901345 A1 | 3/2008 |
| EP | 2151852 A1 | 2/2010 |
| JP | S54112164 A | 9/1979 |
| JP | S54134564 A | 10/1979 |
| JP | S59117235 A | 7/1984 |
| JP | S61245920 A | 11/1986 |
| JP | S62193139 A | 8/1987 |
| JP | S62284707 A | 12/1987 |
| JP | H08176798 A | 7/1996 |
| JP | H10106907 A | 4/1998 |
| JP | H10287497 A | 10/1998 |
| JP | H11240795 A | 9/1999 |
| JP | 2000031253 A | 1/2000 |
| JP | 2000505152 A | 4/2000 |
| JP | 2003234289 A | 8/2003 |
| JP | 2004179452 A | 6/2004 |
| JP | 2004296817 A | 10/2004 |
| JP | 2004342819 A | 12/2004 |
| JP | 2004342976 A | 12/2004 |
| JP | 2006080481 A | 3/2006 |
| JP | 2006135319 A | 5/2006 |
| JP | 2006237262 A | 9/2006 |
| JP | 2006524427 A | 10/2006 |
| JP | 2006352078 A | 12/2006 |
| JP | 2007214199 A | 8/2007 |
| JP | 2008547219 A | 12/2008 |
| JP | 2010073782 A | 4/2010 |
| JP | 2010517295 A | 5/2010 |
| JP | 2010147080 A | 7/2010 |
| JP | 2010186904 A | 8/2010 |
| JP | 2010189745 A | 9/2010 |
| JP | 2011029303 A | 2/2011 |
| JP | 2011035146 A | 2/2011 |
| JP | 2012119591 A | 6/2012 |
| JP | 2012172233 A | 9/2012 |
| JP | 2012253364 A | 12/2012 |
| WO | 2007001299 A1 | 1/2007 |
| WO | 2010081617 A1 | 7/2010 |
| WO | 2010081618 A1 | 7/2010 |
| WO | 2014106177 A1 | 7/2014 |

OTHER PUBLICATIONS

Pizzagalli, L. et al., "Theoretical study of pressure effect on the dislocation core properties in semiconductors," Physical Review B, 79(4): 045203-1 to -7 (Jan. 14, 2009).

Invitation to Pay Additional Fees from Application No. PCT/US2013/078224, dated Jun. 25, 2014 (6 pages).

Invitation to Pay Additional Fees from Application No. PCT/US2013/078295, dated Apr. 9, 2014 (7 pages).

Invitation to Pay Additional Fees from Application No. PCT/US2013/078329, dated Jun. 25, 2014 (6 pages).

International Search Report and Written Opinion received for Application No. PCT/US2013/078224 dated Sep. 11, 2014 (18 pages).

* cited by examiner

APPARATUS FOR STRESSING SEMICONDUCTOR SUBSTRATES

CROSS-REFERENCE TO RELATED APPLICATIONS

This application is a Divisional of U.S. patent application Ser. No. 14/142,559, filed Dec. 27, 2013, which claims the benefit of U.S. Provisional Application No. 61/747,613, filed Dec. 31, 2012; of U.S. Provisional Application No. 61/793,999, filed Mar. 15, 2013; of U.S. Provisional Application No. 61/790,445, filed Mar. 15, 2013 and of U.S. Provisional Application No. 61/788,744 filed Mar. 15, 2013, each of which is incorporated herein by reference.

FIELD OF THE DISCLOSURE

The present disclosure relates generally to apparatus to stress a semiconductor substrate.

BACKGROUND

A continuing need exists for apparatus that may be used to stress a semiconductor structure.

SUMMARY

One aspect of the present disclosure is directed to an apparatus for bending a semiconductor substrate. The substrate has a generally planar position and a bent position. The apparatus includes a chamber and a heater for heating the chamber. A substrate holder is mounted in the chamber. The holder includes a plurality of spaced-apart elongate pins. Each pin has a support surface for contacting the substrate. The support surfaces are disposed for contacting the substrate in the bent position.

In another aspect, an apparatus for bending a semiconductor substrate includes a chamber, a heater for heating the chamber, a pressure modulator for causing a pressure differential across the substrate sufficient to exert stress on the substrate and a substrate holder mounted in the chamber. The substrate has a front surface, a back surface and a peripheral edge. The substrate holder includes a front ring and a back ring. Each ring includes an annular support for contacting the substrate adjacent a peripheral edge of the substrate. The front ring is adapted to contact the front surface and the back ring is adapted to contact the back surface of the substrate.

In yet a further aspect of the apparatus for stressing a semiconductor substrate, the apparatus includes a chamber, a heater for heating the chamber and a substrate holder mounted in the chamber. The substrate has a front surface, a back surface and a peripheral edge. The substrate holder has a front ring, a back ring and a clamp for holding the front ring and back ring. Each ring includes an annular support for contacting the substrate adjacent a peripheral edge of the substrate. The front ring is adapted to contact the front surface and the back ring adapted to contact the back surface of the substrate.

In another aspect of the present disclosure is directed to an apparatus for stressing a generally circular semiconductor substrate. The substrate has a central axis, a front surface and a back surface which are generally perpendicular to the central axis, a peripheral edge extending from the front surface to the back surface and a circumferential groove in the back surface adjacent the peripheral edge. The apparatus includes a chamber, a heater for heating the chamber and a substrate holder mounted in the chamber. The holder includes a generally planar back support having an annular boss sized to be received in the groove in the back surface of the substrate. The boss is movable to exert stress on the substrate.

In a further aspect, an apparatus for stressing a generally circular semiconductor substrate comprises a chamber, a heater and a substrate holder mounted in the chamber. The substrate has a central axis, a front surface and a back surface which are generally perpendicular to the central axis. A peripheral edge extends from the front surface to the back surface. The substrate includes a ring bonded to the back surface adjacent the peripheral edge. The substrate holder includes a generally planar back support having a flange adapted to engage the ring on the back surface of the substrate. The support is movable to exert stress on the substrate.

A further aspect of an apparatus for bending a semiconductor substrate includes a chamber, a heater for heating the chamber, a pressure modulator for causing a pressure differential across the substrate sufficient to exert stress on the substrate and a substrate holder mounted in the chamber. The substrate has a front surface, a back surface and a peripheral edge. The substrate is movable between a generally planar position and a bent position. The substrate holder includes a concave-shaped support having a plurality of holes therethrough. The pressure modulator is adapted to pull a vacuum through the holes to thereby pull the substrate into the concave-shaped support.

Yet a further aspect of the present disclosure is directed to an apparatus for stressing a semiconductor substrate. The substrate has a central axis, a front surface and a back surface which are generally perpendicular to the central axis. A peripheral edge extends from the front surface to the back surface. The apparatus includes a chamber, a heater for heating the chamber and a substrate holder mounted in the chamber. The holder includes a generally planar back support and a press for receiving and compressing the substrate. The press is adapted to generally uniformly compress the substrate radially inward at its peripheral edge toward its central axis.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
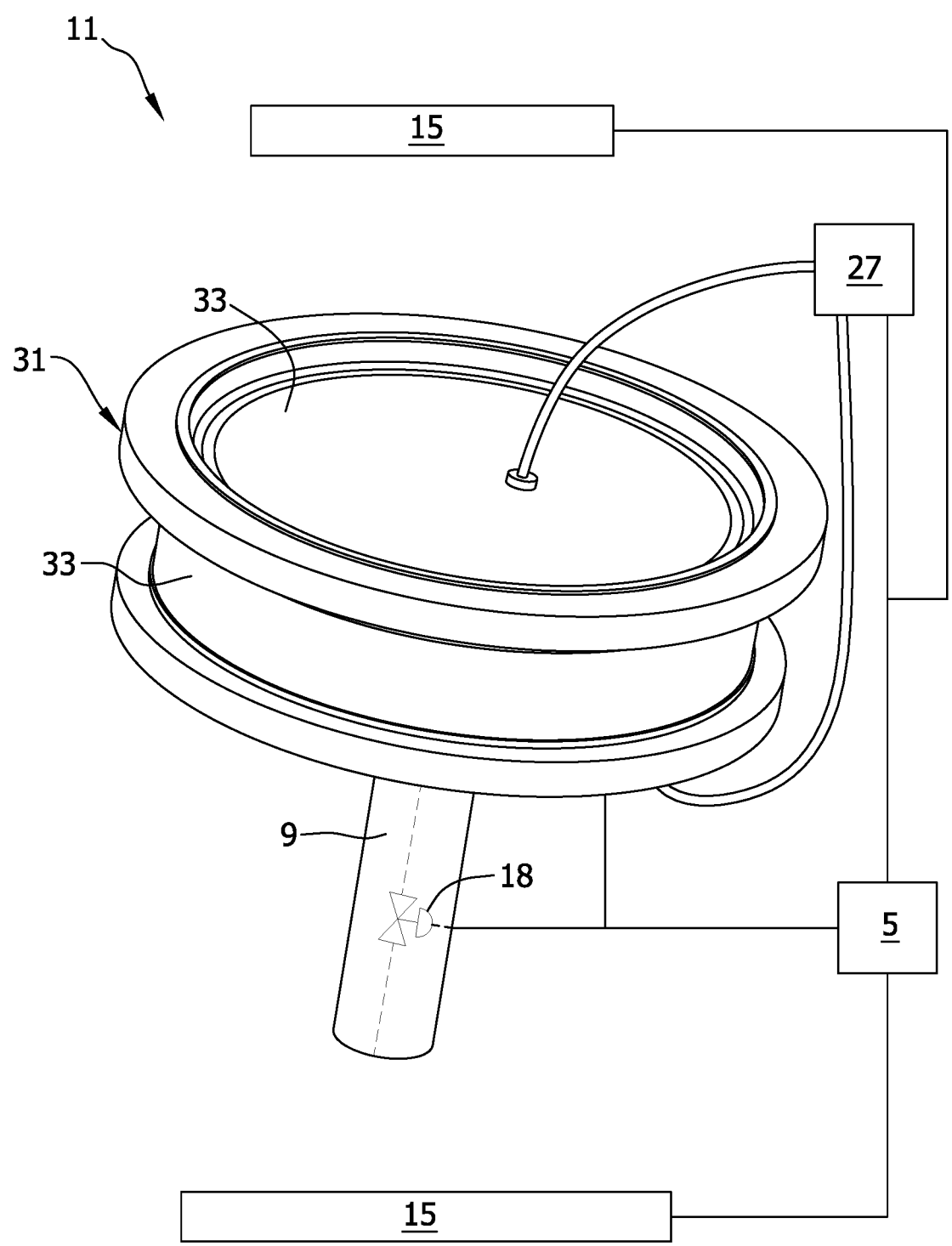
FIG. 1 is a perspective view of an apparatus for processing a semiconductor substrate according to one embodiment of the present disclosure.
Figure 2:
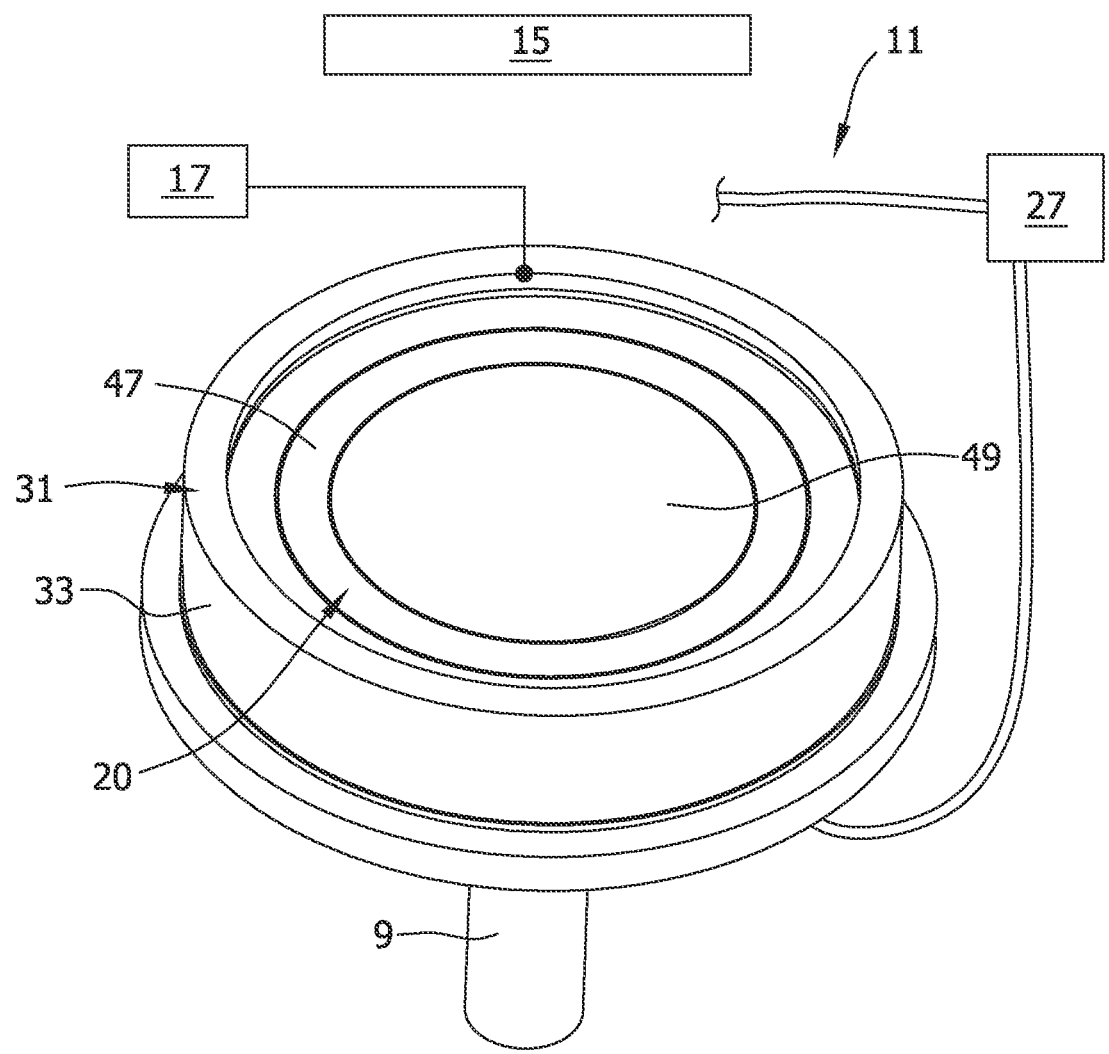
FIG. 2 is a perspective view of the apparatus of FIG. 1 with a portion of a chamber removed for clarity.

Aspects of the present disclosure include apparatus for applying a stress to a semiconductor substrate such as a silicon substrate (e.g., a wafer). Referring now to FIGS. 1-2, the apparatus 11 may include a chamber 31 and a substrate holder 20 having a substrate support 47 for supporting a semiconductor substrate 49. The illustrated apparatus 11 is a single substrate processing apparatus; however, the apparatus and methods disclosed herein are suitable for use in other apparatus including, for example, multiple substrate processing apparatus.

The apparatus may also include a "stressor" for stressing the substrate. For instance, the stressor or stressor assembly may include one or more heaters 15 or a pressure modulator 27. The heater 15 may stress the substrate by causing the substrate to expand at a rate different than the substrate holder (or a portion of the holder) as described below. Alternatively or in addition, the stressor may be pressure modulator 27 that imparts a differential pressure across the substrate. These are merely some examples of possible stressors and others are contemplated within the scope of this disclosure.

The apparatus 11 includes a chamber 31 having an interior space defined in part by walls 33. A perspective of the chamber 31 is shown in FIG. 2 with portions of the chamber walls removed to better illustrate the apparatus 11. Within the interior space of the chamber 31 is a substrate holder 20 to support a semiconductor substrate 49. The holder 20 illustrated in FIGS. 1-2 is a susceptor 47 but other holder arrangements (e.g., tubes, rings, clamps and the like) are contemplated, some of which are more fully described below. The substrate holder is designated as 20 in FIGS. 1-2 and as 20 plus a multiple of 100 (120, 220, 320 etc.) in FIG. 3-34).

The chamber 31 may rest on a shaft 9 or other suitable support. The apparatus 11, such as the shaft 9, may include devices for causing the holder to grasp and/or release the substrate 49, such as suitable control valves and/or hydraulic or pneumatic lines or tensioning cables and the like. The chamber 31 may include other arrangements than those shown herein without departing from the scope of the present disclosure.

The substrate holder or portions of the holder may be generally opaque to absorb radiant heating light produced by heaters 15 such as high intensity radiant heating lamps that may be located above and below the chamber 31. The holder may be constructed of opaque graphite coated with silicon carbide. The walls of the chamber 31 may be made of a transparent material to allow radiant heating light to pass into the chamber. For example, the walls of the chamber 31 may be made of transparent quartz. Quartz is generally transparent to infrared and visible light and is chemically stable under typical processing temperatures.

Heaters 15 other than high intensity lamps may be used to provide heat to the chamber 31 such as, for example, resistance heaters and inductive heaters. In addition or alternatively, the heaters 15 may be included within the interior space of the chamber 31 or may be integral with the chamber walls without departing from the scope of the present disclosure. In other words, the heater or heaters may be of any suitable type, size and shape, and may be disposed inside or outside the chamber. An infrared temperature sensor 17 (FIG. 2) ) such as a pyrometer may be mounted on the chamber 31 to monitor the temperature of the holder 20 or substrate 49 by receiving infrared radiation emitted by the holder or substrate. A system controller 5 (FIG. 1) may be used to control various operating parameters associated with the chamber 31 including, for example, stressor control, gas flow rates and chamber temperature and pressure. It should be understood that apparatus and chamber designs other than that shown in FIGS. 1-2 may be utilized without departing from the scope of the present disclosure.

In certain embodiments, the apparatus 11 may be configured for and/or include structure suitable for applying a stress to a semiconductor substrate and, optionally, for depositing a semiconductor material such as an epitaxial layer on the substrate. In such embodiments, a process gas that includes the semiconductor material may flow into the apparatus 11 from a source of process gas, such as a gas cylinder, to a gas manifold (not shown) and into the chamber 31. Gas may be introduced to the chamber 31 before, throughout or after processing. The gas may be heated prior to contacting the substrate 49. The process for depositing an epitaxial layer on a surface of the semiconductor substrate may include methods known in the art and as, for example, as described in U.S. Pat. Nos. 5,789,309; 5,904,769 and 5,769,942. Typically, growth of the epitaxial layer is achieved by chemical vapor deposition. Generally speaking, chemical vapor deposition involves the introduction of volatile reactants with a carrier gas (usually hydrogen) into the chamber 31.

Various embodiments of the substrate holder for use in applying a stress to a semiconductor substrate will now be described. Some alternative embodiments of substrate holders and stressors (e.g., heater, pressure modulators and the like) for stressing a semiconductor substrate are illustrated below, but other holders and stressors are contemplated within the scope of this disclosure. It should be understood that the holders and stressors may be utilized as a part of the apparatus 11 and chamber 31 described above and may be used in combination with a heater for heating the chamber.

Figure 3:
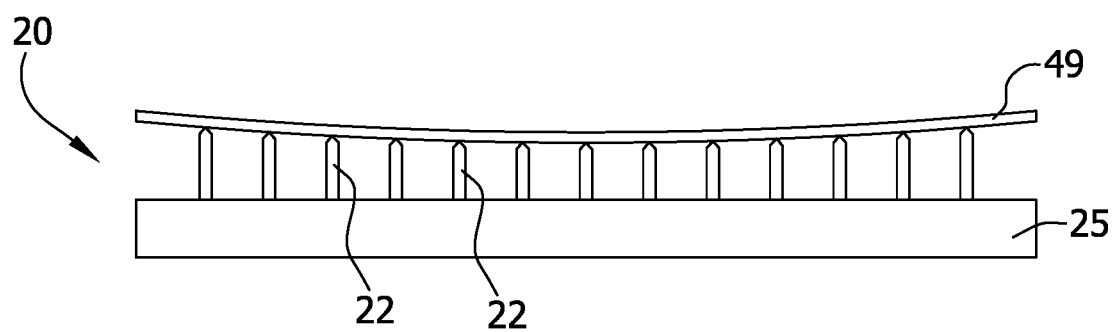
FIG. 3 is a cross-section view of a substrate holder of one embodiment of the present disclosure.
Figure 4:
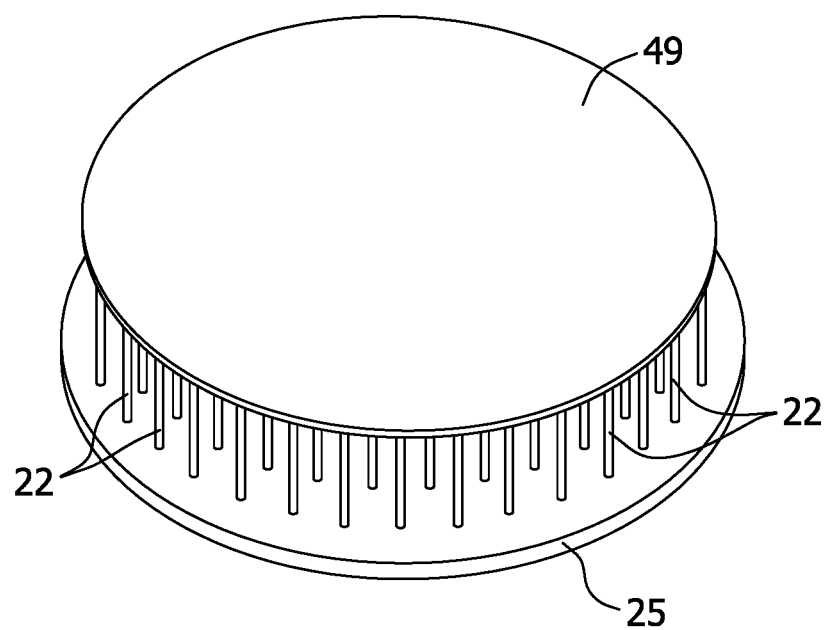
FIG. 4 is a perspective view of the substrate holder of FIG. 3.

Referring now to FIGS. 3-4, a substrate holder 20 may include a number of spaced-apart elongate pins 22 that support the semiconductor substrate 49. The pins 22 are attached to a mounting block 25. A force may be applied to the substrate 49 to cause the substrate to move (e.g., bend) and contact the pins. The pins 22, or the upper portions thereof, may collectively define a support surface that is disposed for contacting the substrate 49 in the bent (i.e., stressed) position.

The pins 22, or the upper portions thereof, may be arranged in a concave pattern such that upon application of a sufficient force, the substrate 22 deforms or bends from its substantially planar shape to conform to the concave arrangement of the pins. By deforming in this manner, the substrate 22 is stressed.

In certain other embodiments, the apparatus includes a pressure modulator as shown in FIG. 1 (and FIG. 7 below) to create a pressure differential across the substrate that is sufficient to exert stress on the substrate. Other stressors may be used in these embodiments.

Figure 5:
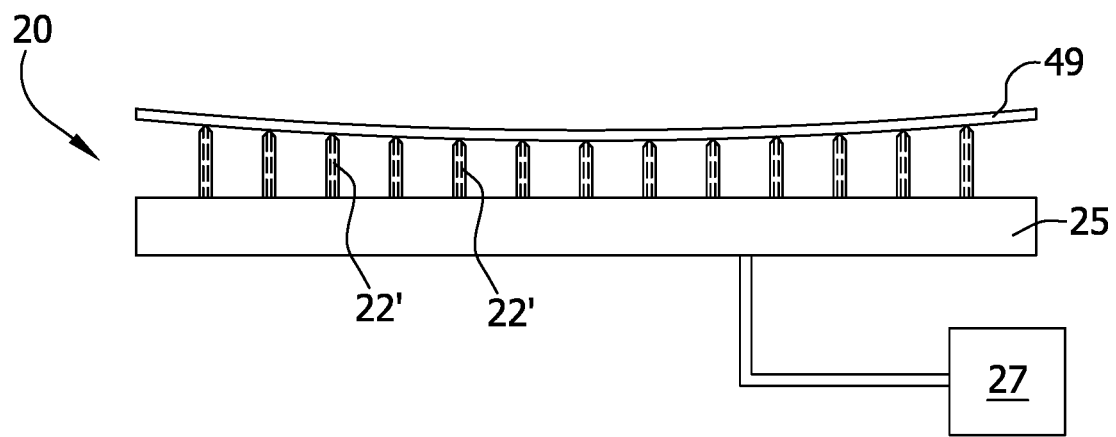
FIG. 5 is a cross-section view of a substrate holder of a second embodiment of the present disclosure.
Figure 6:
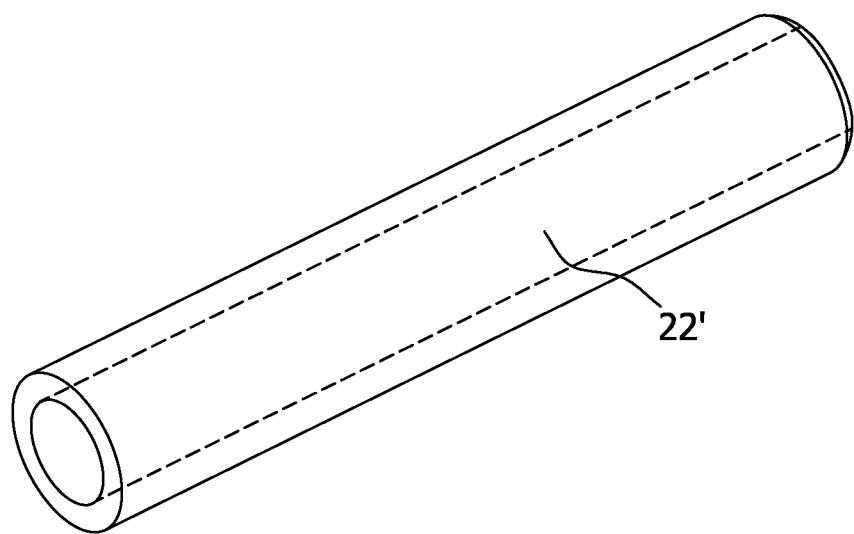
FIG. 6 is a perspective view of a tubular pin used in the substrate holder of FIG. 5.
Figure 7:
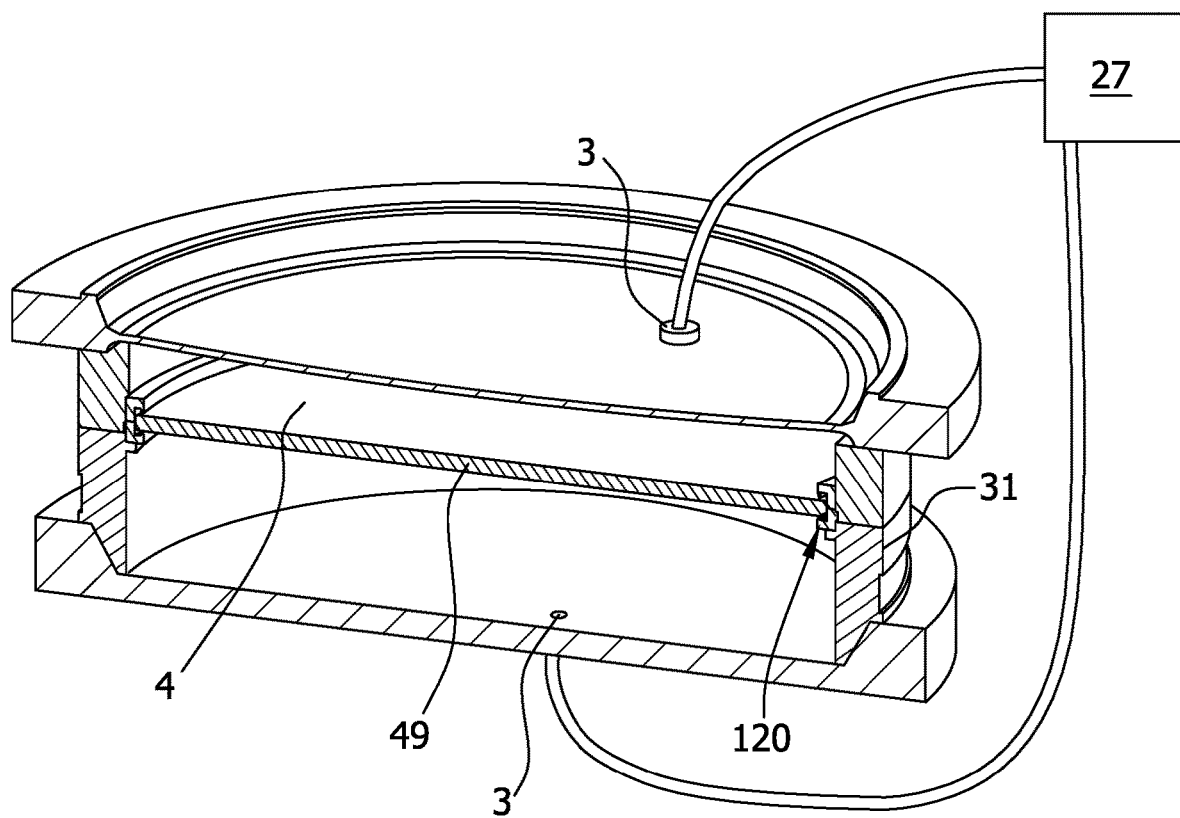
FIG. 7 is a cross-section view of a second embodiment of an apparatus for stressing a semiconductor substrate.

As shown in FIGS. 5-6, pins 22' may be tubular, thereby defining a lumen for fluid flow. In some embodiments, the pins 22' are fluidly connected to a pressure modulator 27 such as a pump for pulling a vacuum. The vacuum applied to the substrate 49 may pull the substrate toward the pins by a pulling force. For example, variation in distance between the pins and substrate via a concave pattern of the pins may cause different amounts of pulling force to be applied to portions of the substrate. These differential forces cause stress to be applied to the semiconductor substrate 49.

The pins 22, 22' generally support the substrate in the vertical direction but may be configured so that they do not restrict movement of the substrate in horizontal or radial directions. Allowing radial movement of the substrate during heating allows the substrate to expand radially without causing slip and dislocations. The pins may extend through (rather than from) a mounting block and be connected through a series of conduits as described below and shown in FIGS. 31-35.

Figure 8:
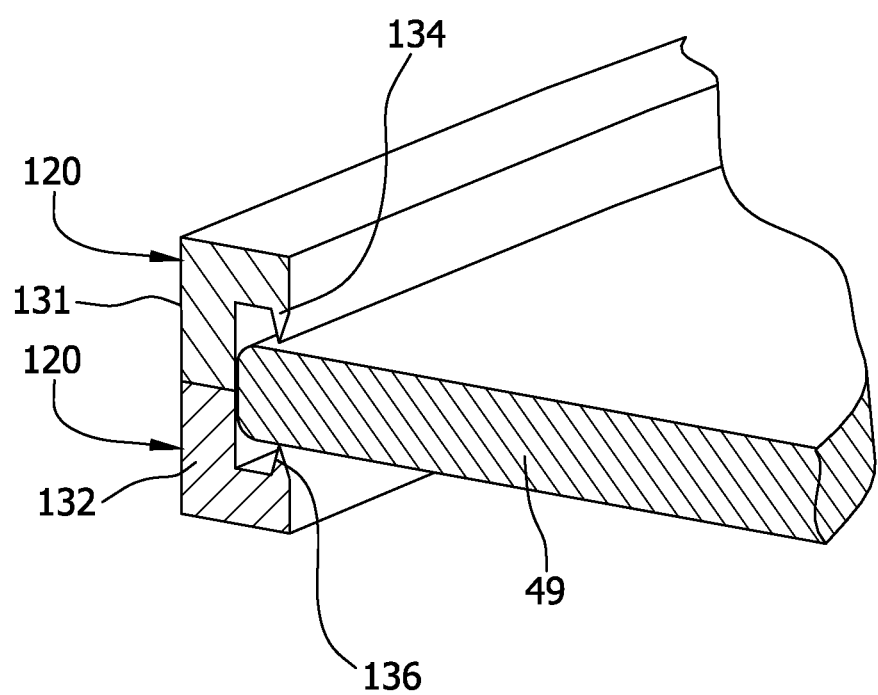
FIG. 8 is a partial cross-section view of the substrate holder of the apparatus shown in FIG. 7.

Referring now to FIGS. 7-12, in one embodiment of an apparatus for bending a semiconductor substrate, the apparatus includes a substrate holder 120 having a front ring 131 and a back ring 132. The front ring 131 includes an annular front support 134 and the back ring 132 includes an annular back support 136 for contacting and supporting the substrate 49. Note the front and back rings may have an L-shaped cross-section as shown in FIG. 8. The front ring 131 is generally adapted to contact the front surface of the substrate 49 at a discrete radial position and the back ring 132 is generally adapted to contact the back surface of the substrate 49 at a discrete radial position. The radial position is slightly inward from the substrate edge. The radial position at which the front annular support 134 and back annular support 136 contact the substrate 49 may be the same as illustrated in FIG. 8 or may be different without departing from the scope of the present disclosure.

Figure 10:
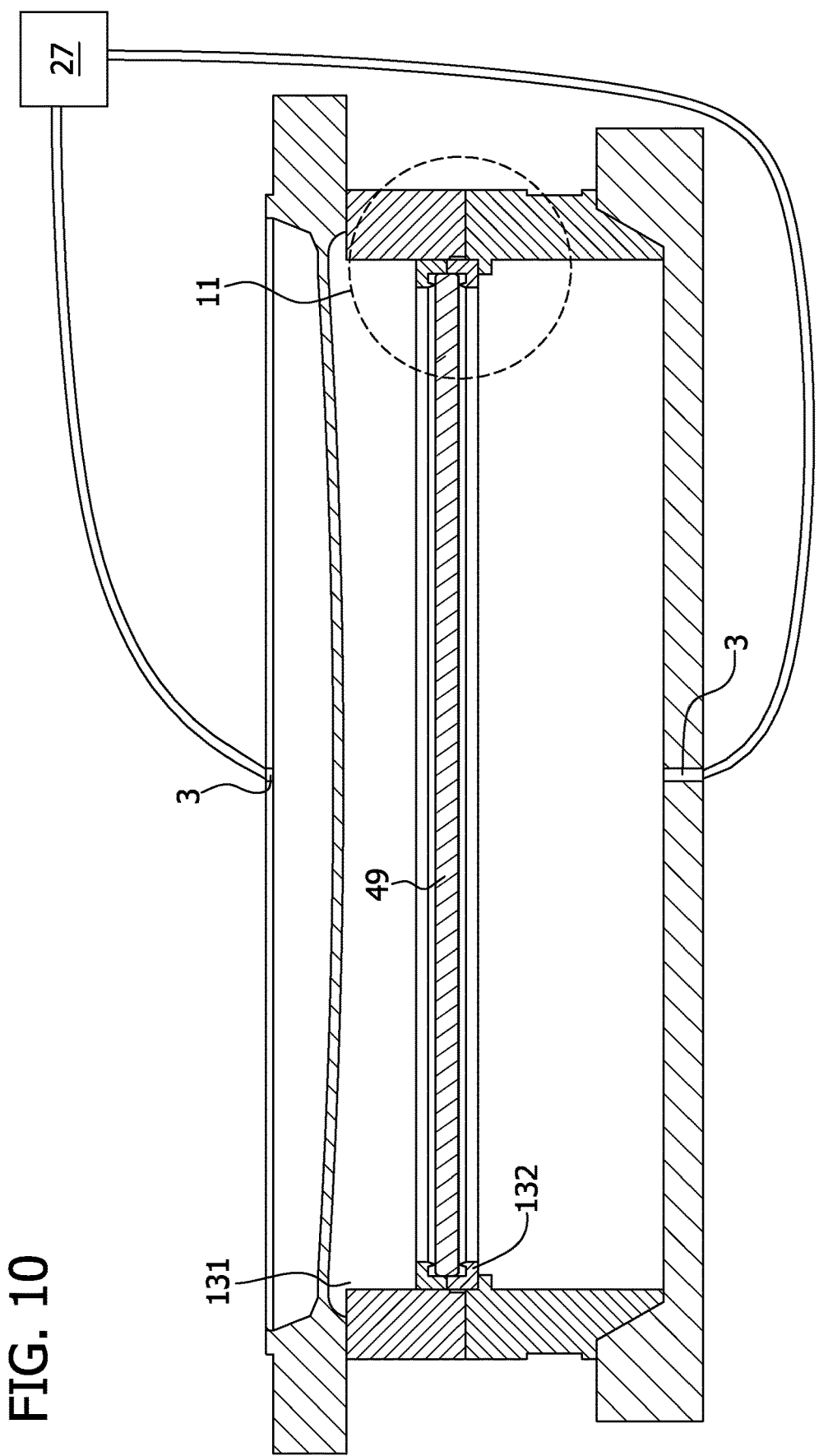
FIG. 10 is a cross-section view of a third embodiment of an apparatus for stressing a semiconductor substrate.
Figure 11:
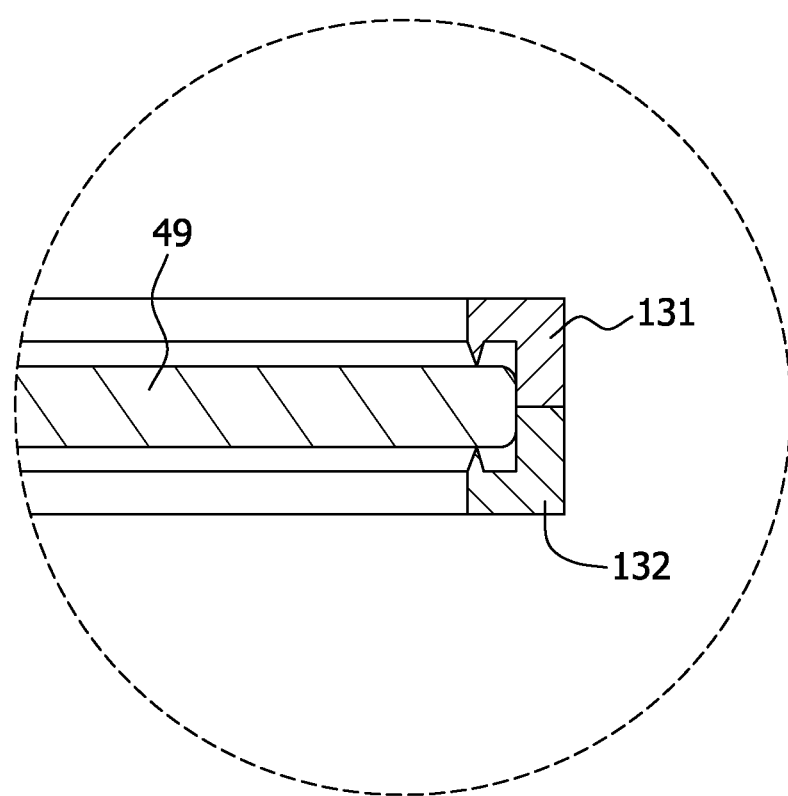
FIG. 11 is a partial cross-section view of the substrate holder of the apparatus shown in FIG. 10.
Figure 12:
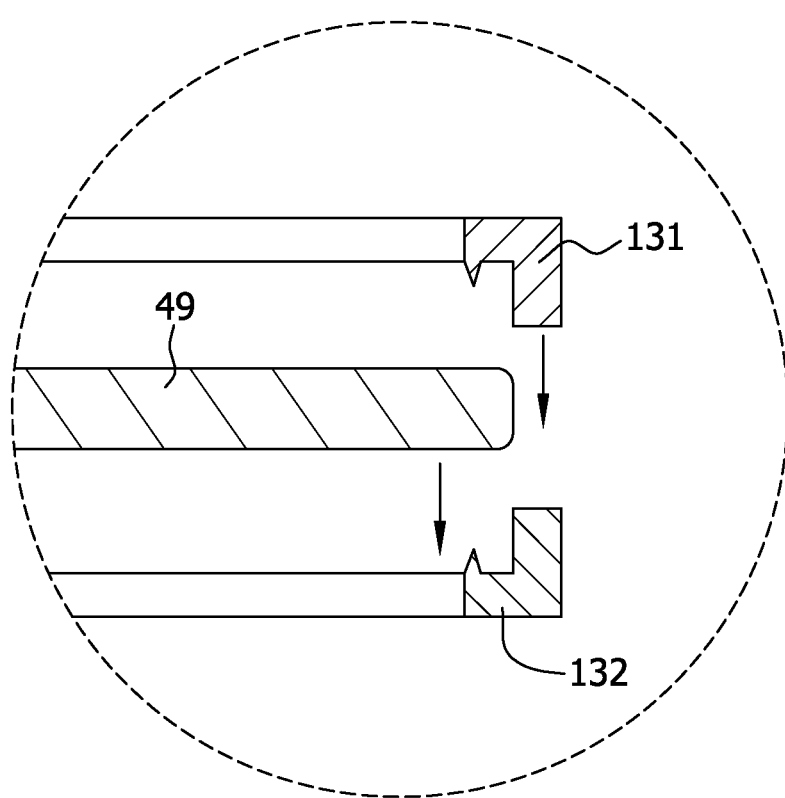
FIG. 12 is a partial cross-section view of the substrate holder illustrating movement of the substrate and top ring upon application of the holder by arrows.

Referring to FIG. 10, the apparatus for bending the substrate 49 (e.g., stressor) may include a pressure modulator 27 such as a pump to cause a differential pressure across the substrate. In other words, pressure is higher on one side of the wafer than the other. This differential pressure stresses the substrate and may bend the substrate. In such embodiments, the front ring 131 and back ring 132 act as a seal such that the differential pressure across the substrate 49 may be maintained. The pressure modulator 27 may be in fluid communication with a vent 3 that extends through the wall of the chamber 31 to a sealed cavity 4 within the chamber. The differential pressure applied across the substrate 49 may cause the substrate to bend in the direction of lower pressure.

Figure 9:
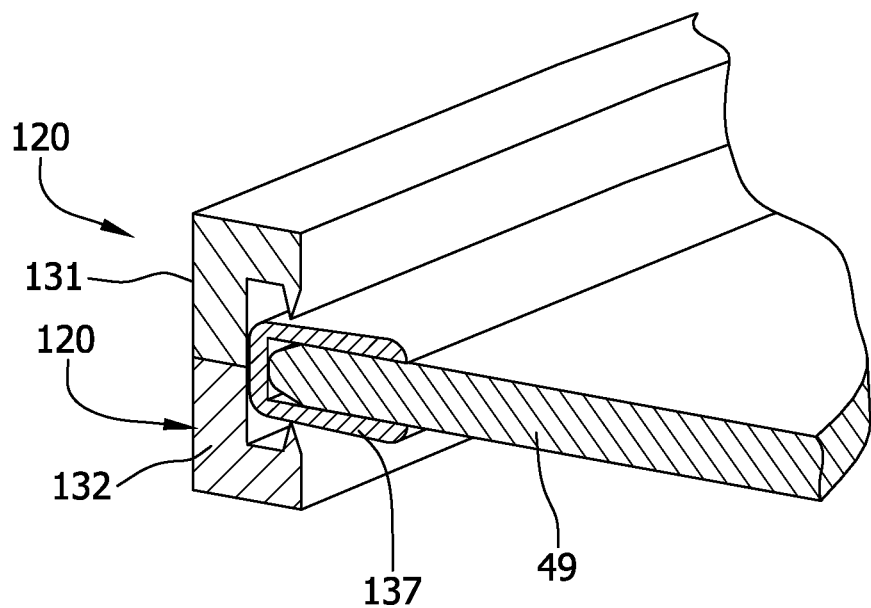
FIG. 9 is a partial cross-section view of the substrate holder showing a coating on the peripheral edge of the substrate.

Bending of the substrate 49 may cause surfaces of the substrate to move between the front and back rings 131, 132. Further, thermal expansion of the substrate 49 (i.e., a thermal expansion greater than the thermal expansion of the rings 131, 132) may cause the surfaces to move between the rings 131, 132. In one embodiment and as shown in FIG. 9, a protective coating 137 covers a portion of the substrate 49 and, in particular, covers the peripheral edges of the substrate. The coating 137 may generally be any protective material that protects the wafer from damage (such as slip and dislocations) while the substrate is held between the rings 131, 132.

Figure 13:
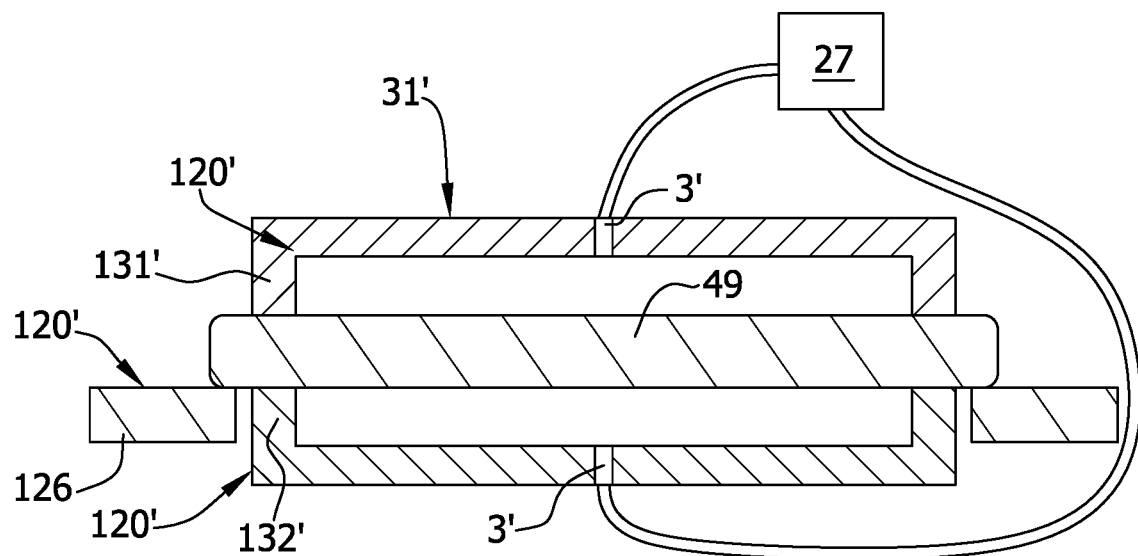
FIG. 13 is a partial cross-section view of a fourth embodiment of an apparatus for stressing a semiconductor substrate.

Referring now to FIG. 13, a front ring 131' and back ring 132' of the holder 120' may be arranged such that the rings contact the substrate 49 near but not at the peripheral edge of the substrate as with the rings 130, 131 of apparatus 120 (FIG. 8). The rings 131', 132' may be integral with the lid and/or bottom of the chamber 31'. Vents 3' may extend through the rings 131', 132' of the chamber 31'. The vents 3' may be located near the center of the substrate 49 and may limit the deflection of the substrate upon activation of the pressure modulator 27.

The holder 120' may also include a planar support 126 that supports the substrate 49 such as before application of the rings 131', 132'. In certain embodiments, the substrate 49 is attached to the planar support 126. The planar support may be made of a material that has a different thermal expansion coefficient than the substrate (i.e., the rings thermally expand at a different rate than the substrate) to cause the substrate to compress or stretch when the support and substrate are heated or cooled.

Figure 14:
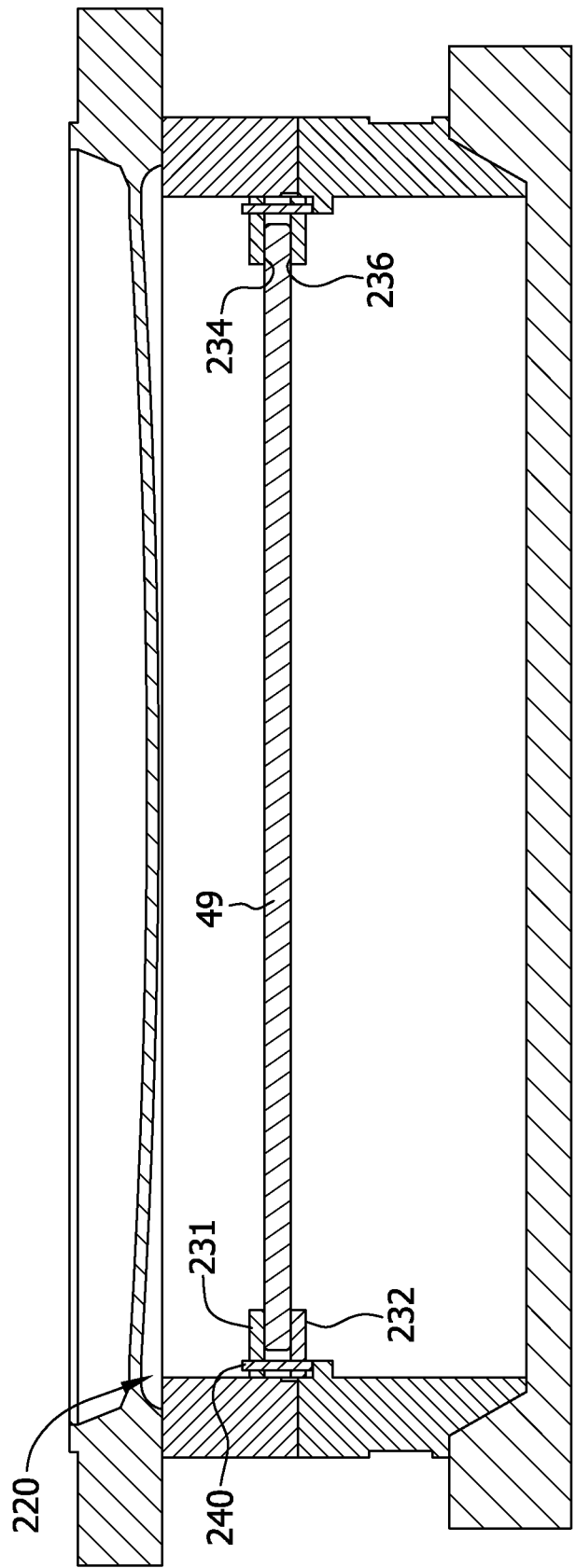
FIG. 14 is a cross-section view of a fifth embodiment of an apparatus for stressing a semiconductor substrate.
Figure 15:
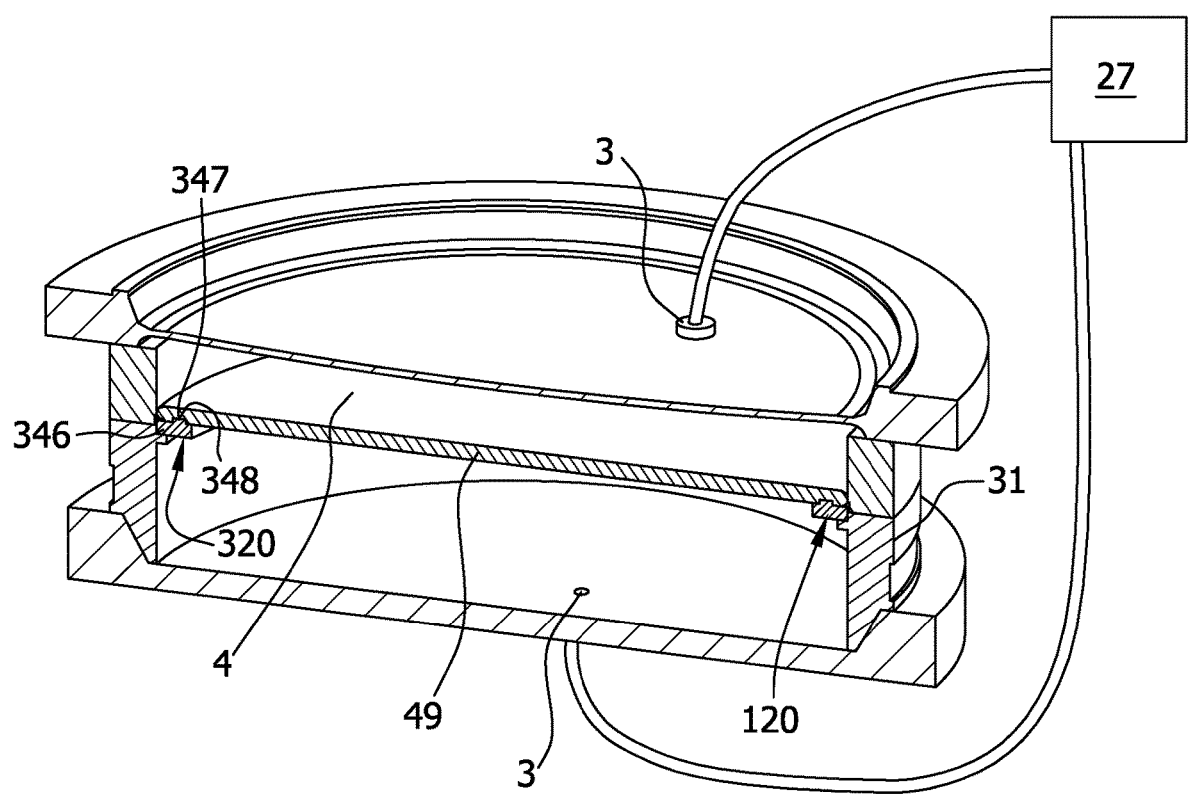
FIG. 15 is a cross-section view of a sixth embodiment of an apparatus for stressing a semiconductor substrate.
Figure 16:
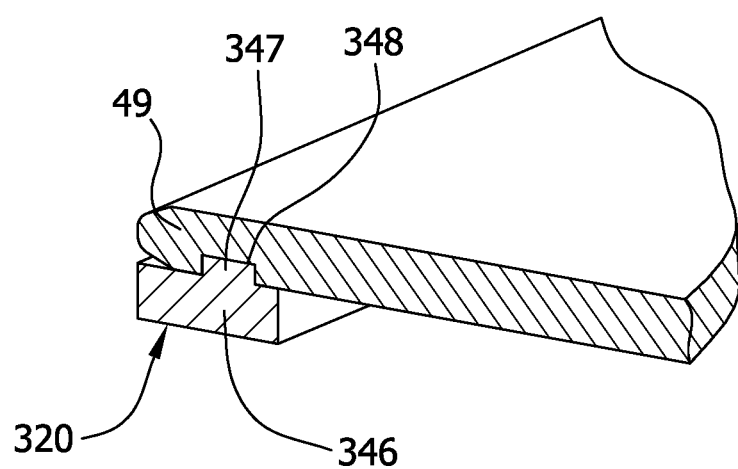
FIG. 16 is a cross-section view of the substrate holder of the apparatus shown in FIG. 15.

Referring to FIG. 14, in some embodiments of the apparatus, the apparatus exerts stress on the substrate 49 by use of the thermal expansion of the substrate. The substrate holder 220 may include a clamp 240 including a front ring 231 and a back ring 232 that exerts a holding force on the substrate 49. The front ring 231 includes an annular front support 234 and the back ring 232 includes an annular back support 236. The supports 234, 236 contact the substrate 49 at the peripheral edge of the substrate and are adapted to contact the front and back of the substrate respectively. For example, the substrate holder 220 illustrated in FIG. 14 may be used without a pressure modulator. It should be noted that the rings, supports, bosses, clamps and the like of the various holders described herein may also be moved radially by any mechanical method including use of pneumatics, hydraulics, motors and the like.

The rings 231, 232 may be constructed of a material that has a different thermal expansion coefficient than the substrate (i.e., the rings thermally expand at a different rate than the substrate). The holding force of the clamp 240 in combination with the differential expansion rates of the rings 231, 232 upon heating or cooling causes stress in the substrate 49. In embodiments where the rings 231, 232 have a larger expansion coefficient than the substrate 49, the rings cause the substrate to stretch radially. In embodiments where the rings 231, 232 have a smaller expansion coefficient than the substrate 49, the substrate exerts an inward force on the substrate (i.e., compression of the substrate) which results in bending of the substrate.

Referring now to FIGS. 15-18, in another embodiment, a substrate holder 320 includes a generally planar back support 346 that includes an annular boss 347 that is sized and shaped to be received in a groove 348 in the back of the substrate 49. The boss 347 is movable such that it exerts stress on the substrate 49. For instance, the back support 346 may be made of a material that expands at a lesser rate than that of the substrate 49 upon heating causing compression of the substrate. Alternatively, the back support 346 may be made of a material that expands at a greater rate than that of the substrate 49 upon heating causing stretching of the substrate.

Figure 17:
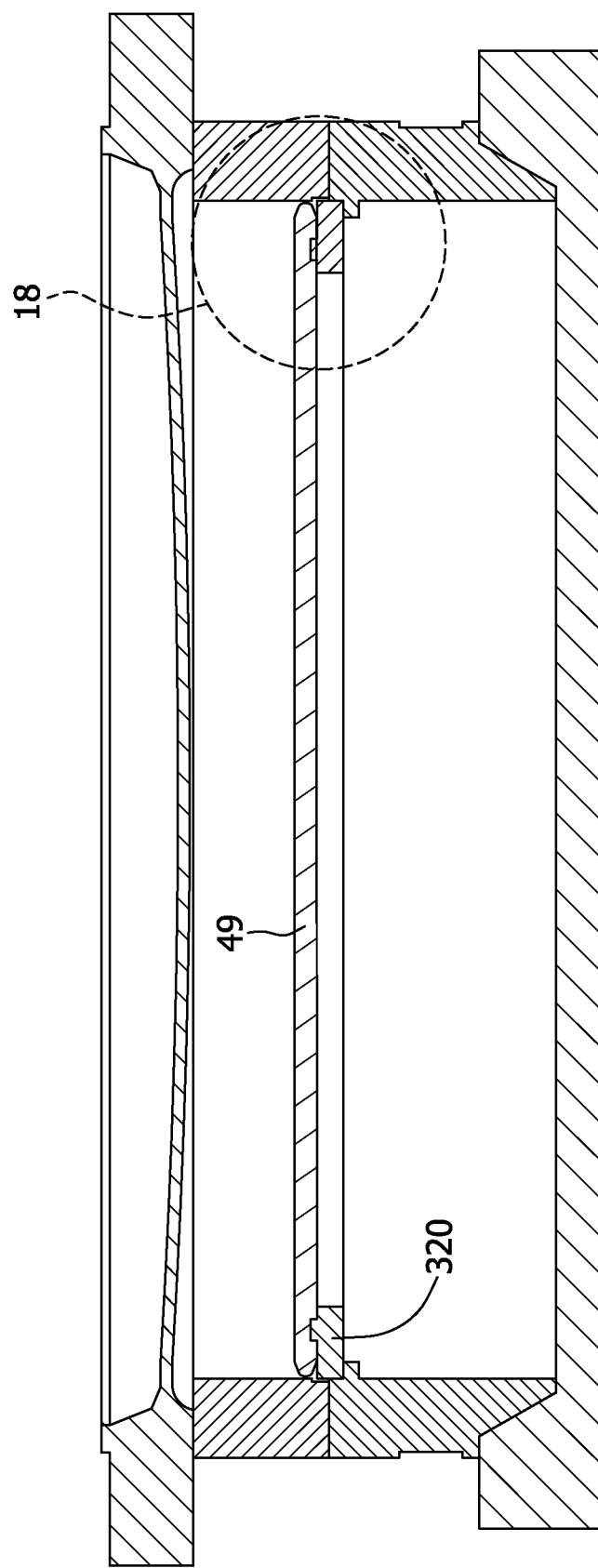
FIG. 17 is a cross-section view of the apparatus.
Figure 18:
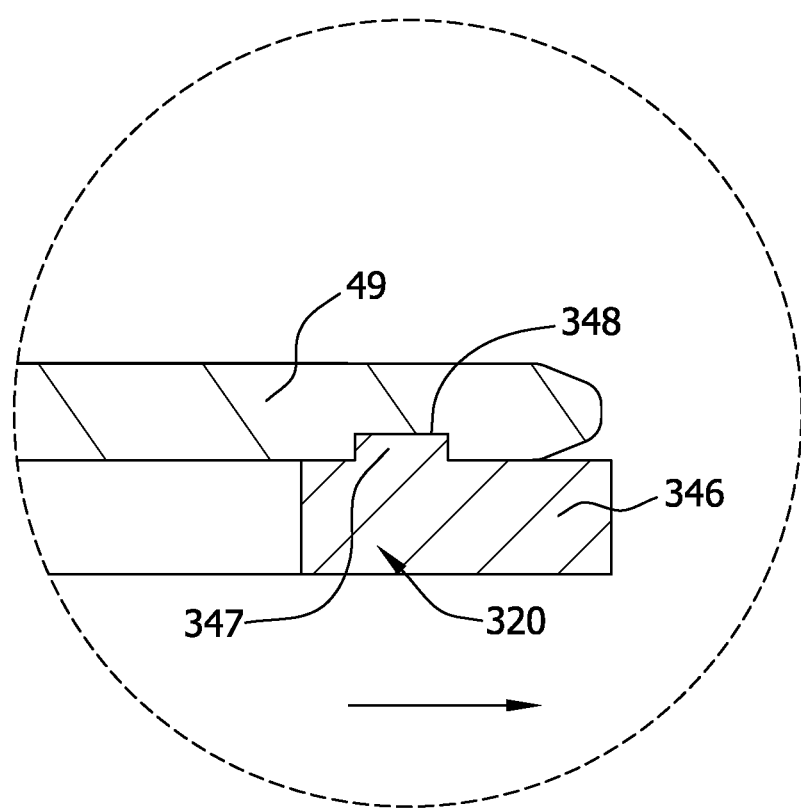
FIG. 18 is a cross-section view of the substrate holder of FIG. 18 indicating stretching of the substrate by an arrow.

The substrate holder 320 may also include a front ring and back ring (not shown) with annular supports similar to the front ring 131 and back ring 132 shown in FIG. 8 for sealing of the substrate and allowing a pressure modulator to create a pressure differential across the substrate to stress the substrate. The chamber 31 that contains the holder 320 may include a vent 3 and sealed cavity 4 for application of a vacuum or pressure (FIG. 17). The back ring may be interior to the back support 346 and the front ring may be aligned with the back ring or may be sized and shaped to be closer to the peripheral edge of the substrate than the back ring. The substrate may include a coating as shown in FIG. 9.

Figure 19:
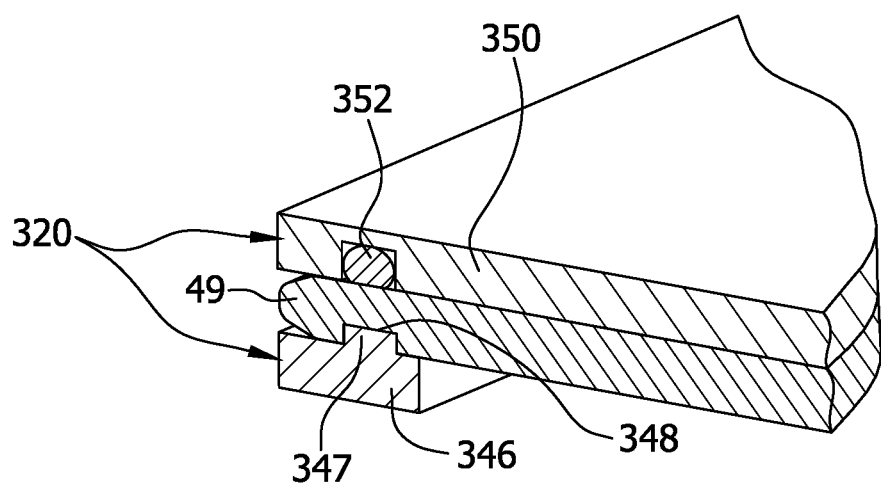
FIG. 19 is a partial cross-section view of a third embodiment of a substrate holder.
Figure 20:
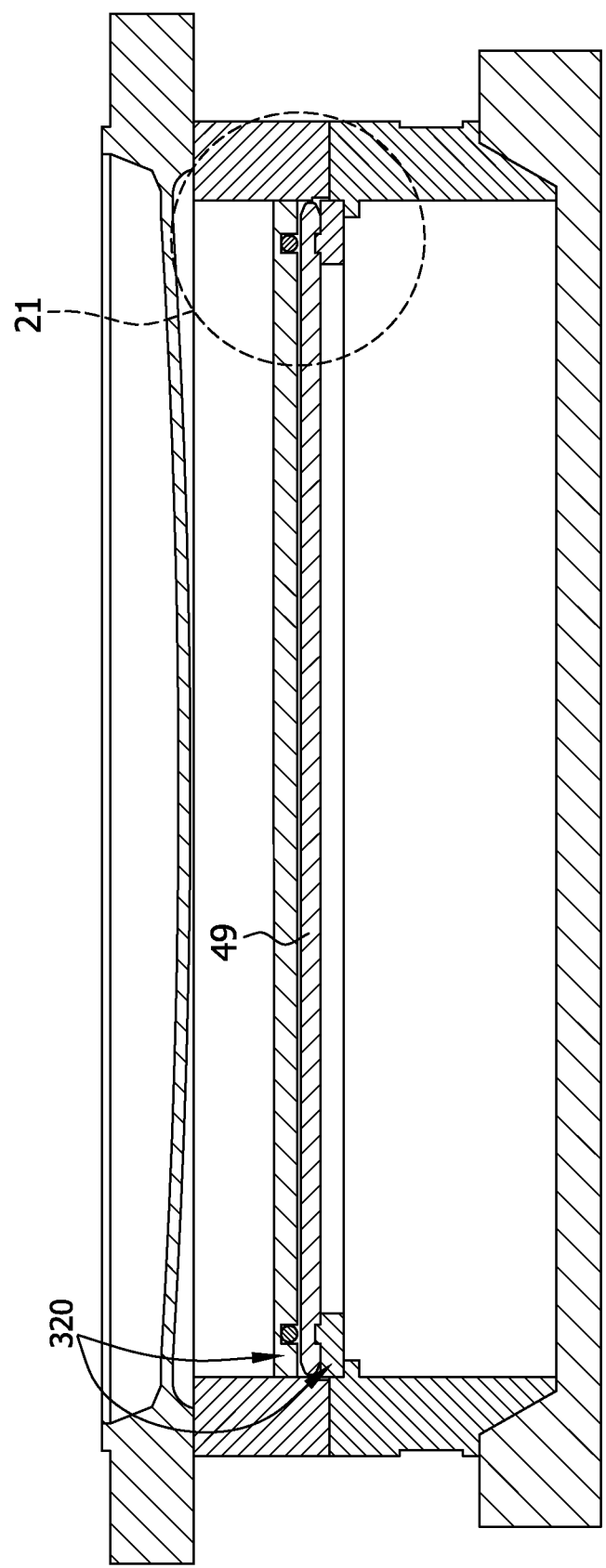
FIG. 20 is a partial cross-section view of an apparatus with the substrate support of FIG. 19.
Figure 21:
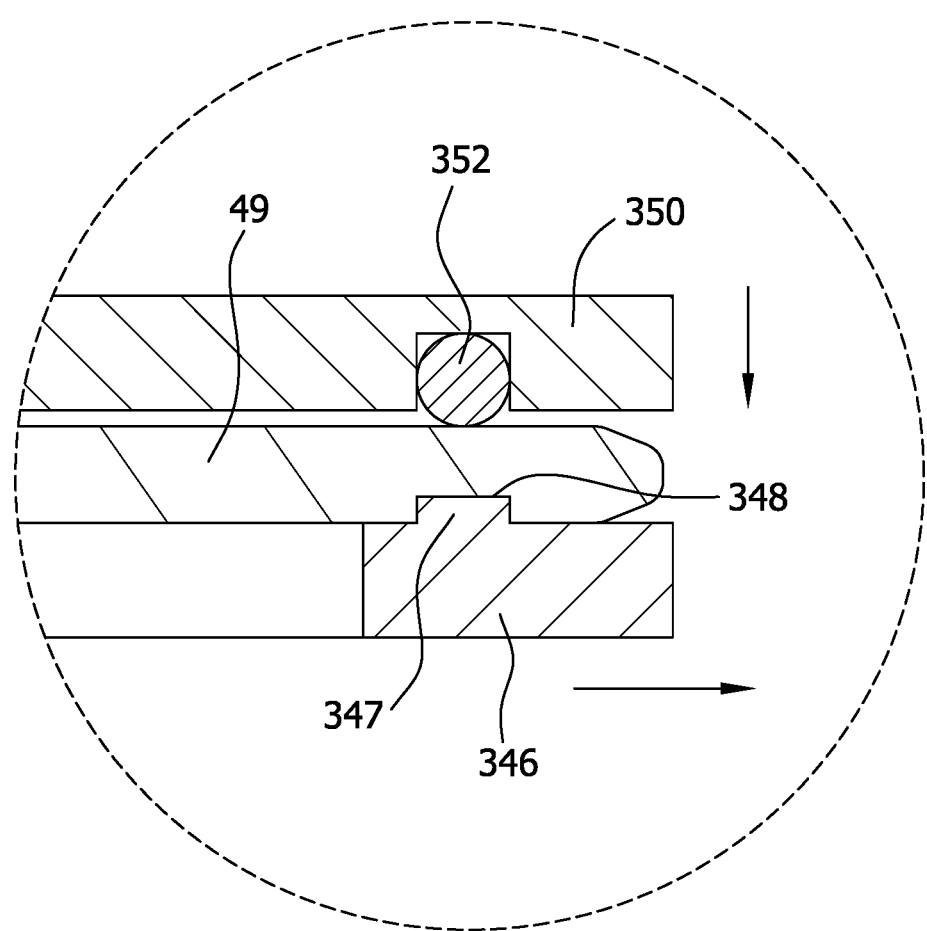
FIG. 21 is a partial cross-section view of the substrate holder of FIG. 19.

In some embodiments and as shown in FIGS. 19-21, the substrate holder 320 also includes a front support 350 having an annular ring 352 that extends from the front support. The ring 352 exerts a downward force on the substrate 49 to prevent the substrate from dislodging from the boss 347 during compression or expansion of the substrate during heating. Other structures for accomplishing this function are contemplated within the scope of this disclosure.

Figure 22:
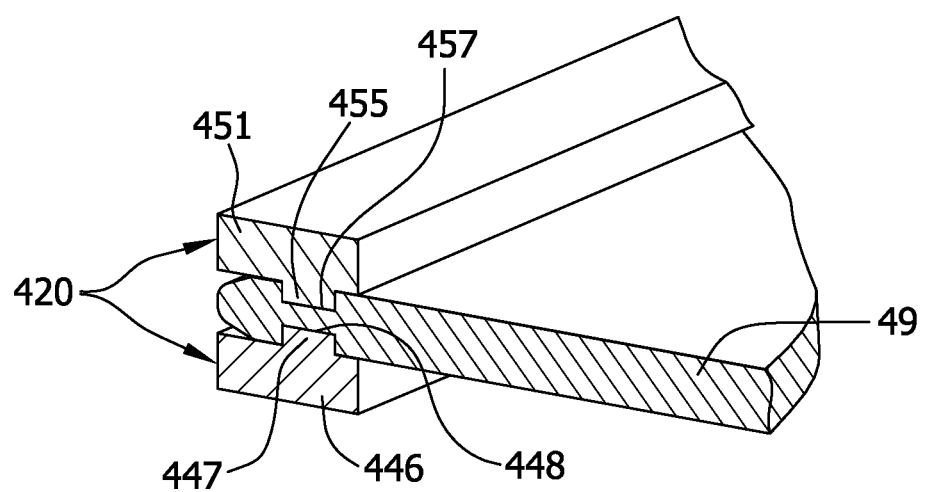
FIG. 22 is a partial cross-section view of a fourth embodiment of a substrate holder.
Figure 23:
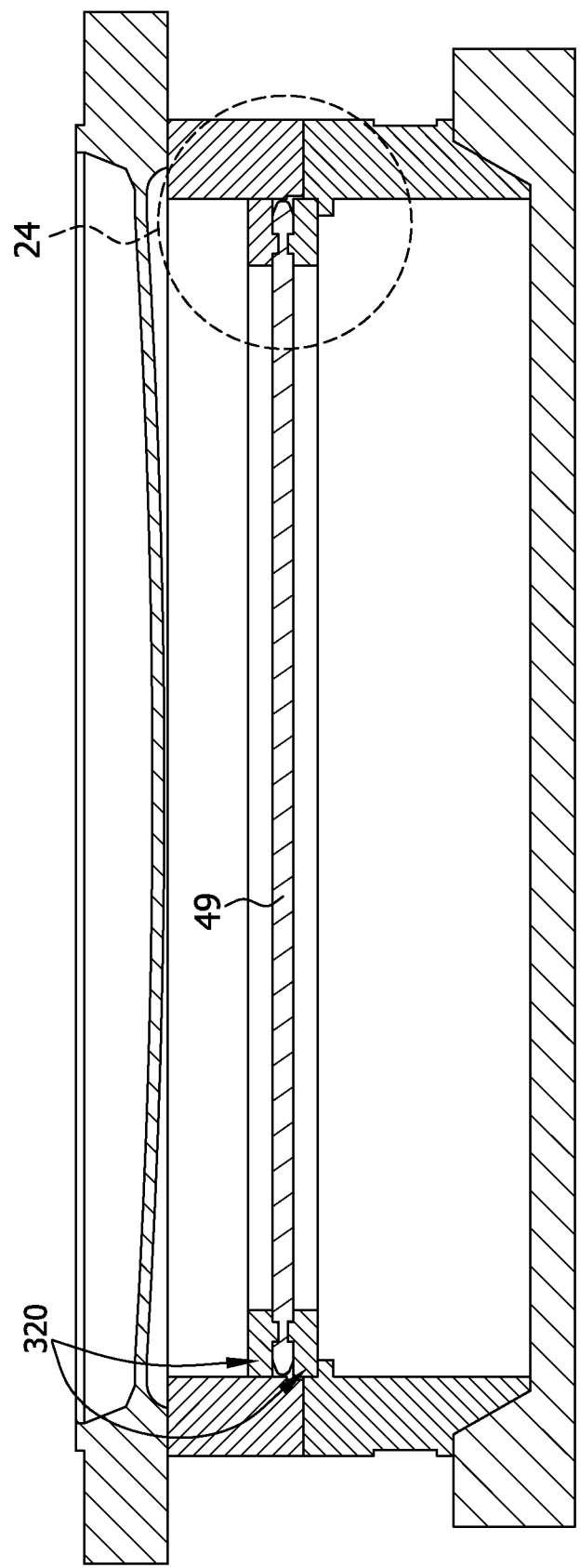
FIG. 23 is a partial cross-section view of an apparatus with the substrate support of FIG. 22.
Figure 24:
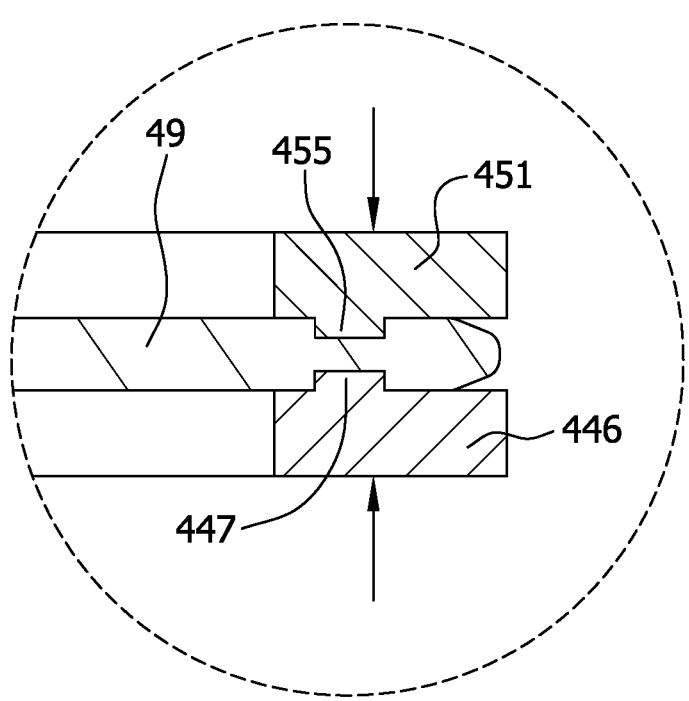
FIG. 24 is a cross-section view of the substrate holder of FIG. 23 illustrating the direction of application of the front and back support by arrows.

In other embodiments and as shown in FIGS. 22-24, the substrate holder 420 includes a back support 446 and boss 447 similar or identical to that shown in FIGS. 15-21. The substrate holder 420 also includes a front support 451 and a front boss 455 that is sized and shaped to be received in a groove 457 in the front surface of the substrate 49. The front support 451 may also be made of a material that expands at a lesser rate than that of the substrate 49 upon heating causing compression of the substrate or may be made of a material that expands at a greater rate than that of the substrate 49 upon heating causing stretching of the substrate.

Figure 25:
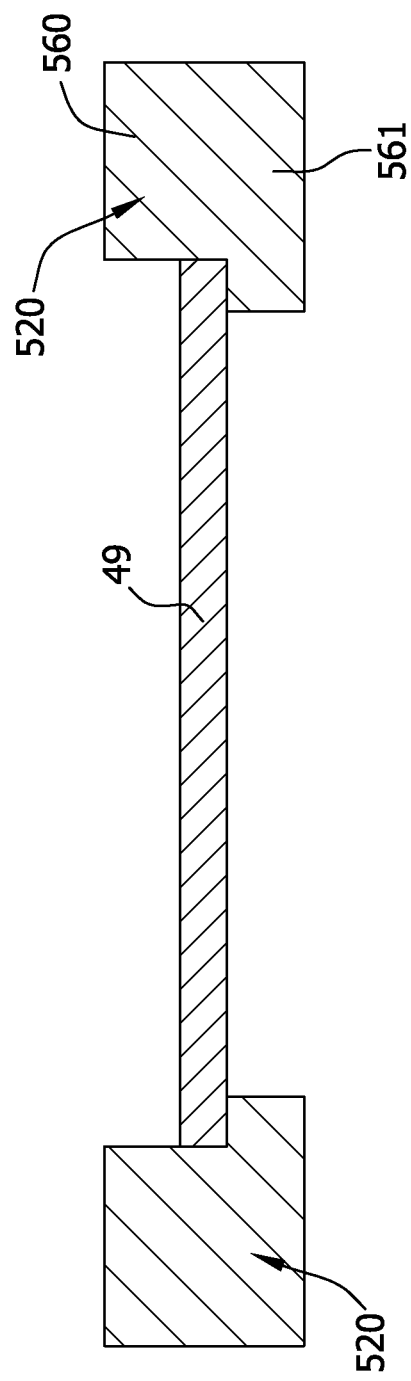
FIG. 25 is a cross-section view of another a fifth of a substrate holder.
Figure 26:
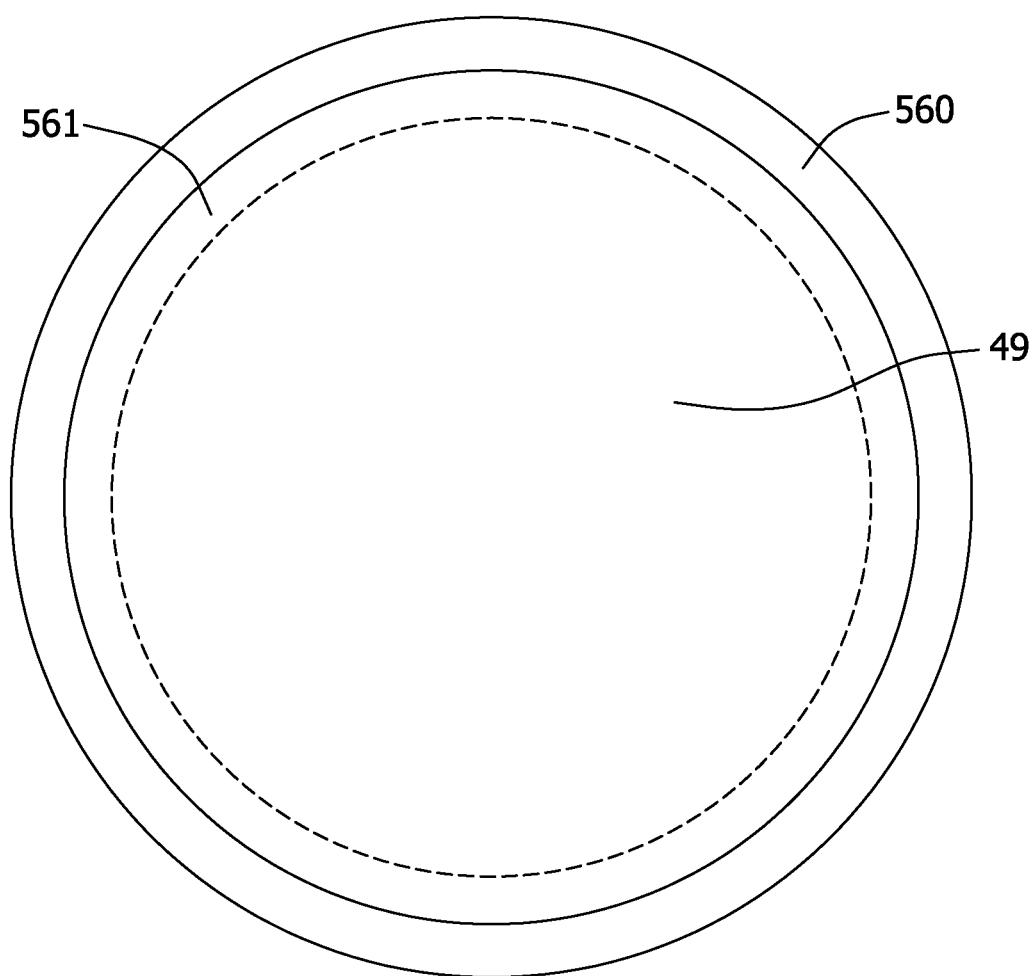
FIG. 26 is a cross-section view of a sixth embodiment of a substrate holder.
Figure 27:
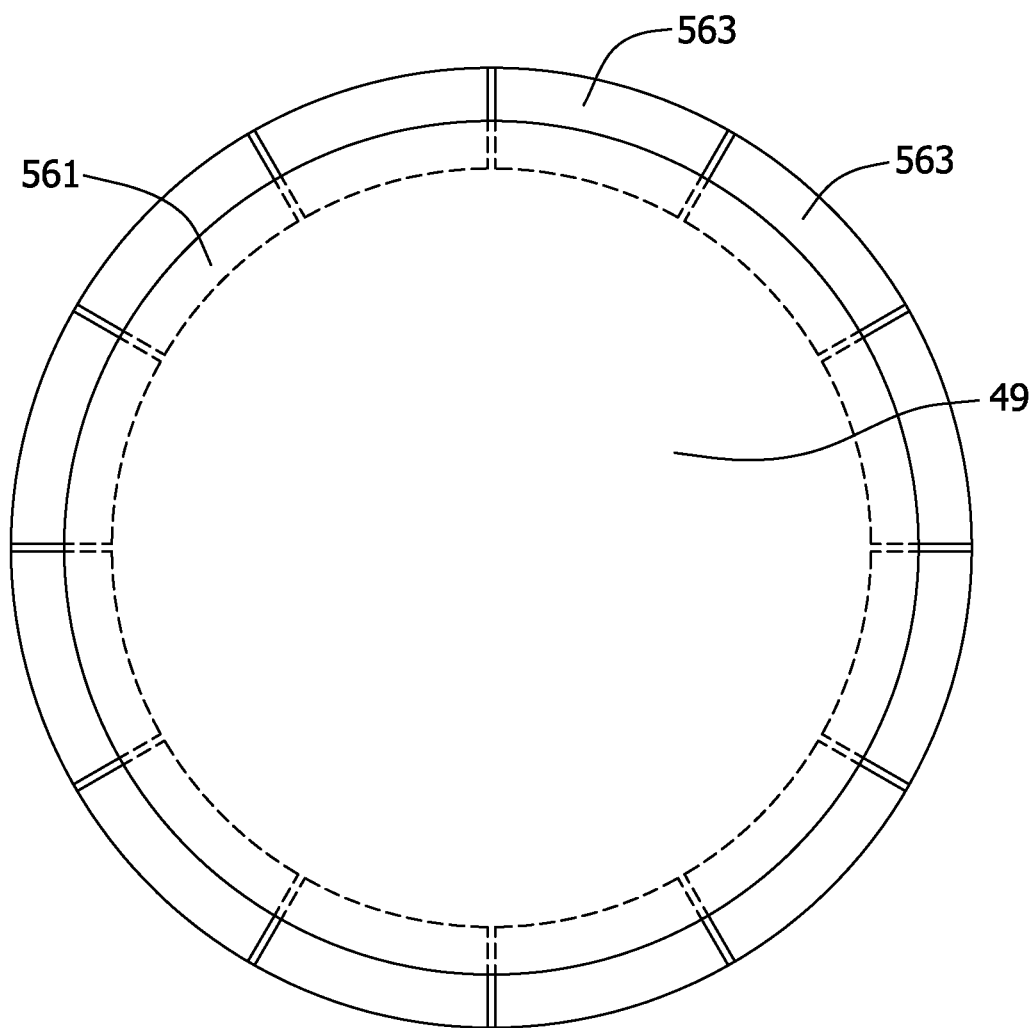
FIG. 27 is a cross-section view of a seventh embodiment of a substrate holder.

Referring to FIGS. 25-27, stressing apparatus 520 of this embodiment includes a planar back support 561 for supporting the substrate 49 and a generally circular press 560 with a circular opening for receiving and compressing the substrate. The planar support may extend only partially toward the center of the substrate as in FIGS. 26-28 or may extend continuously beneath the substrate 49. The press 560 may continuously encircle the substrate or, as shown in FIG. 27, may include a plurality of arc-shaped segments 563 that form the opening for receiving the substrate 49. The press 560 and/or segments 563 may be movable inward relative to the substrate 49 to compress the substrate. For instance, the press 560 may be moved as a result of being composed of a material that expands at a lesser rate than that of the substrate 49 such that the press will compress the substrate upon application of heat. The substrate holder 520 may also include front and/or back rings (not shown) to form a seal upon use of a pressure modulator for creating a pressure differential across the substrate as described above.

Figure 28:
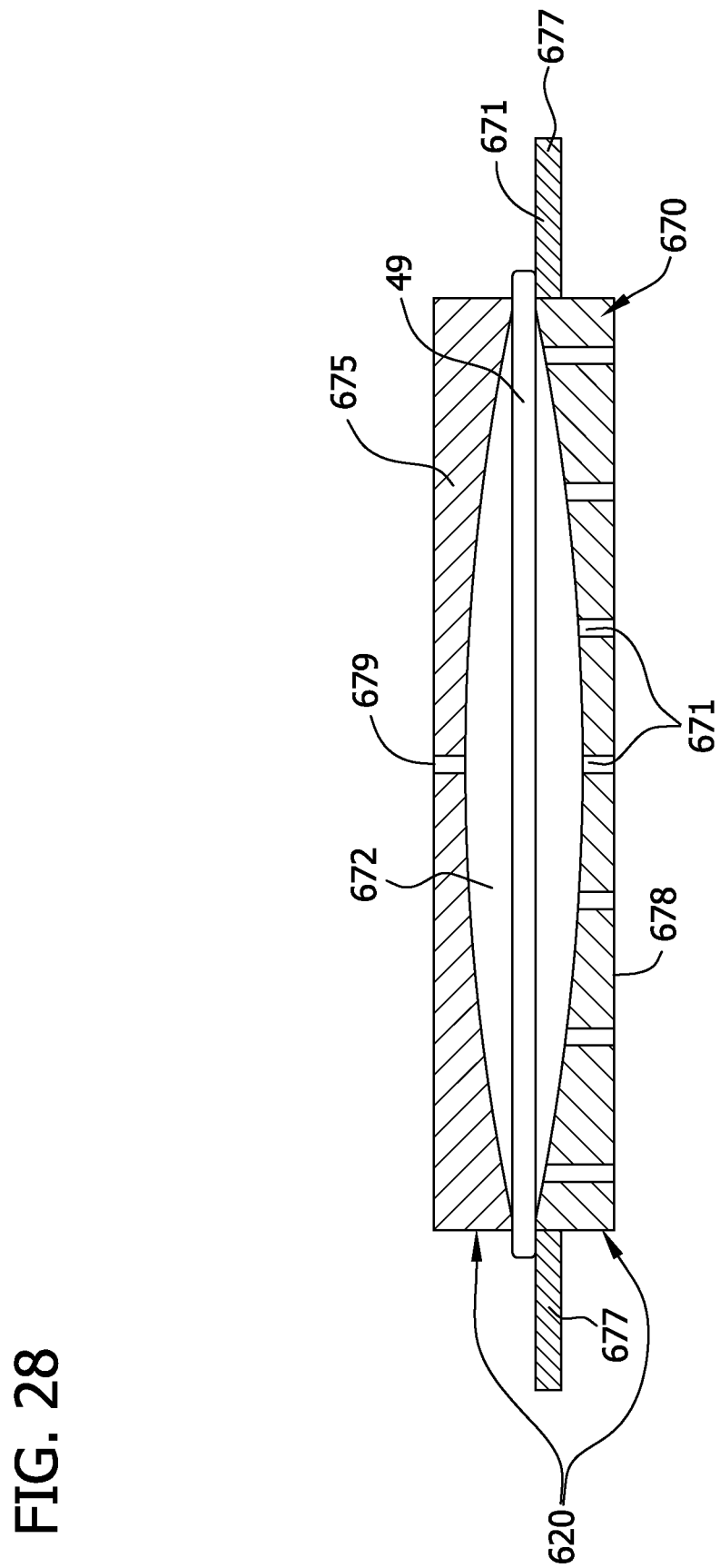
FIG. 28 is a cross-section view of a seventh embodiment of an apparatus for stressing a semiconductor substrate.

Referring now to FIG. 28, the substrate holder 620 includes a first concave-shaped support 670 and a second concave-shaped support 675 opposite the first concave-shaped support. The first concave-shaped support 670 includes a plurality of holes 671 formed therein for pulling a vacuum through the holes and for pulling the substrate 49 toward the first concave-shaped support. An upper portion 677 of the first support 670 contacts a portion of the substrate 49 in its unbent position. A lower portion 678 that is generally larger than the upper portion and which contains the holes 671 for pulling a vacuum contacts the substrate when it is in its bent position. A vent 679 is formed in the second support 675 and the support forms a cavity 672 to allow a vacuum to be pulled through the vent and cavity to stress the substrate. The annular support 675 generally only contacts the substrate 49 near or at the peripheral edge of the substrate.

Figure 29:
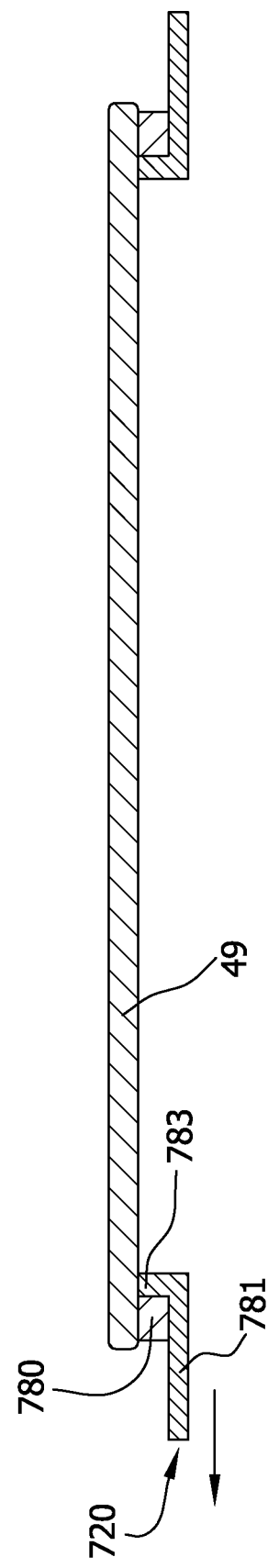
FIG. 29 is a cross-section view of an eighth embodiment of a substrate holder.

Referring to FIG. 29, a substrate holder 720 includes a generally planar back support 781 and a flange 783. The substrate 49 includes a ring 780 attached to the back surface of the substrate near the peripheral edge of the substrate. The flange 783 is adapted to engage the ring 780. The support 781 and flange 783 are movable relative to the substrate to compress the substrate. For instance, the support 781 and/or flange 783 may be moved as a result of being composed of a material that expands at a greater rate than that of the substrate 49 such that the flange 783 will stretch the substrate upon application of heat. In embodiments where the ring 780 of the substrate is interior to the flange 783 (not shown), the support 781 and/or flange 783 may be moved as a result of being composed of a material that expands at a lesser rate than that of the substrate 49 such that the flange 783 will compress the substrate upon application of heat.

Figure 30:
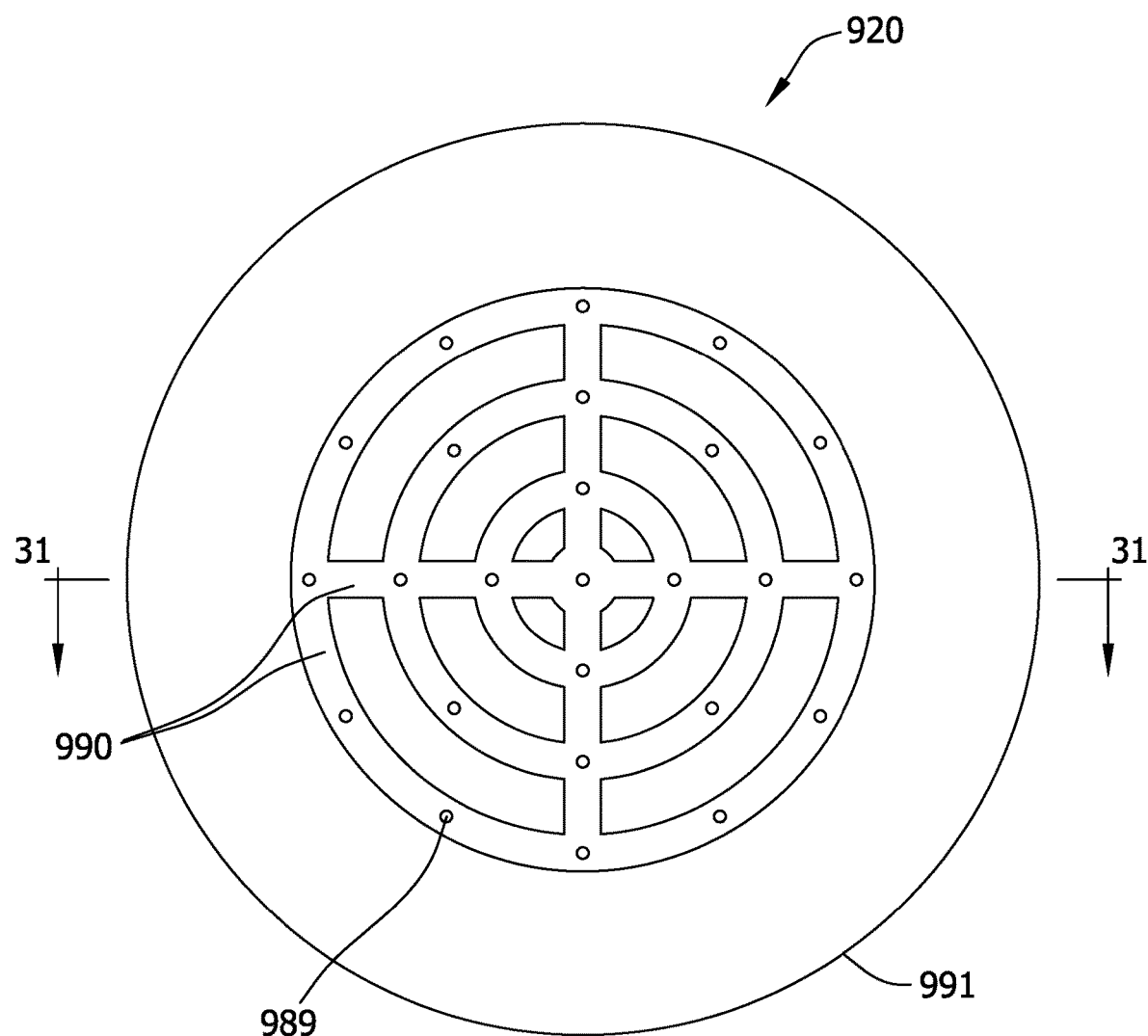
FIG. 30 is a bottom view of a substrate holder of a tenth embodiment of a substrate holder.
Figure 31:
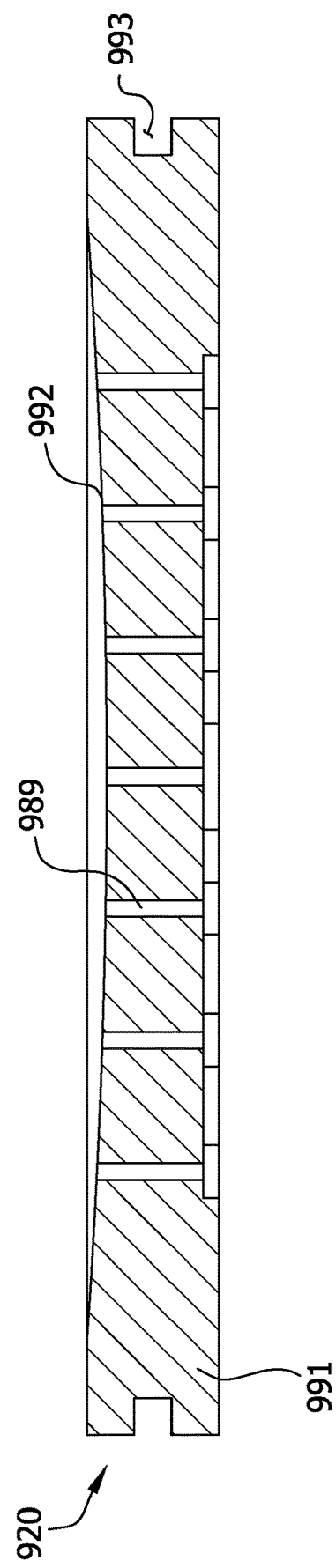
FIG. 31 is a cross-section view of the substrate holder of FIG. 31.
Figure 32:
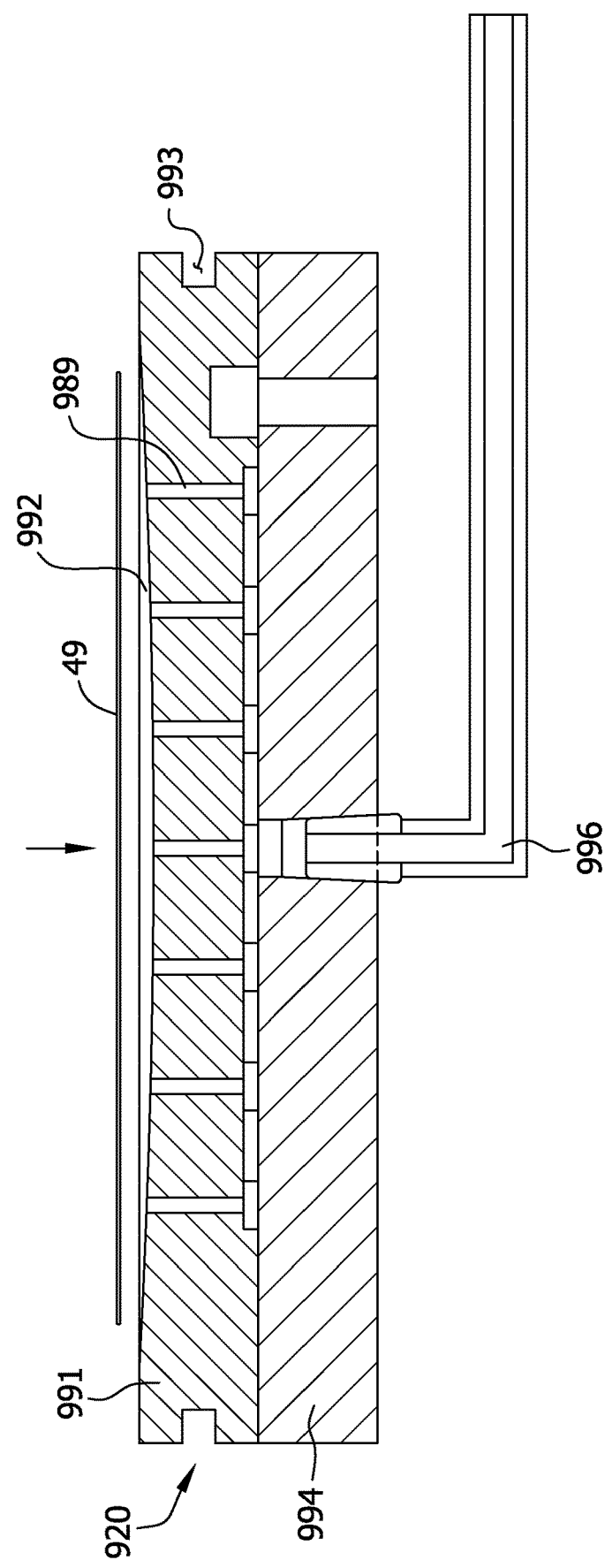
FIG. 32 is a cross-section view of the substrate holder mounted to a mounting block support.
Figure 33:
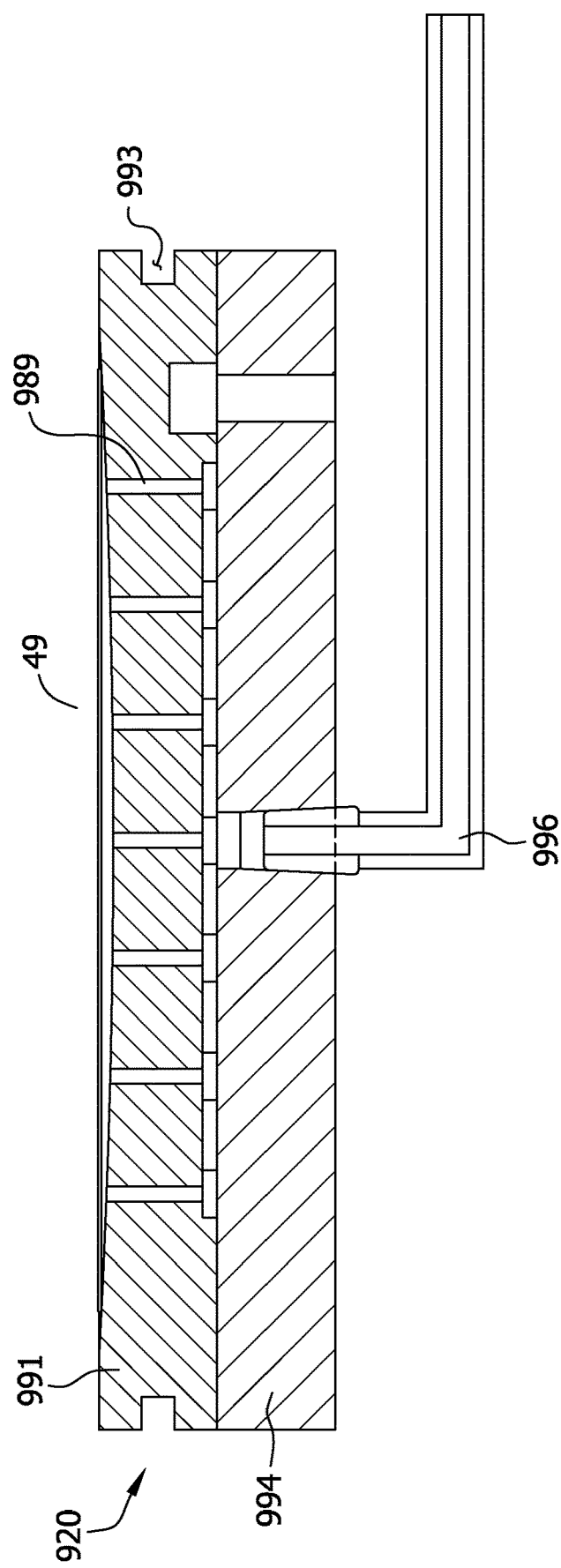
FIG. 33 is a cross-section view of the substrate holder and mounting block support with a substrate loaded thereon.
Figure 34:
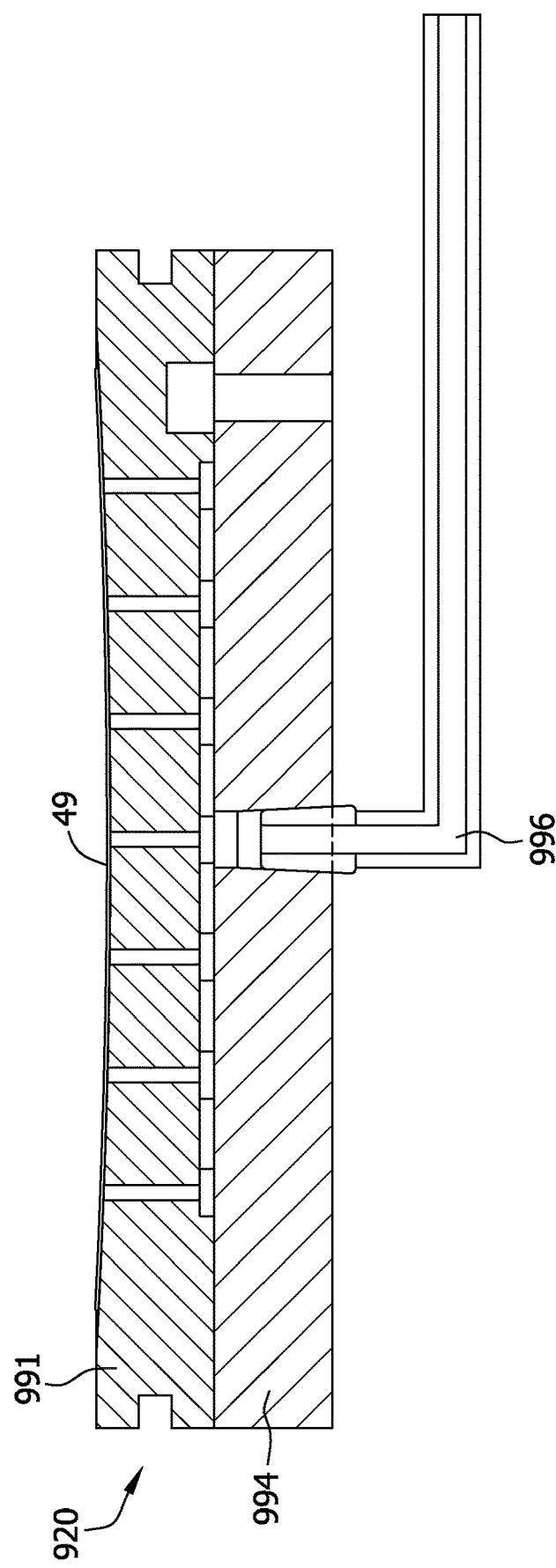
FIG. 34 is a cross-section view of the substrate holder and mounting block support with a substrate in a stressed position.

FIG. 30 illustrates the bottom of a mounting block 991 of a substrate holder 920. A series of tubes 989 extend through the mounting block 991 to a concave-shaped support 992 (FIG. 32). The tubes 989 are connected via a series of conduits 990. The mounting block 991 may include a handling groove 993 for inserting and removing the mounting block from the processing chamber 31 (FIG. 1). As shown in FIG. 32, the mounting block 991 may be supported on a mounting block support 994 within the chamber. A vacuum tube 996 extends through the mounting block support 994 and is in fluid communication with the conduits 990 and tubes 989 upon insertion of the mounting block into the chamber 31 (FIG. 1). A substrate 49 is placed on the mounting block 991 (FIG. 33). Upon application of vacuum, the substrate 49 bends toward the concave-shaped support 992 causing stress in the substrate (FIG. 34).

Generally, the stress on the substrate may be directed perpendicular to the axis of the substrate, either by compressing or stretching by use of the embodiments of the apparatus shown in, for example, FIGS. 14-27 and 29. Alternatively the stress may be directed along or parallel to the axis of the substrate, such as by use of the embodiments of the apparatus shown in, for example, FIGS. 5, 7-13, 28 and 30-34.

When introducing elements of the present disclosure or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. An apparatus for stressing a semiconductor substrate, the substrate having a front surface, a back surface and a peripheral edge, the apparatus comprising:
   one or more chamber walls that fully enclose a processing chamber,
   a heater for heating the chamber,
   a substrate holder mounted in the processing chamber fully enclosed by the chamber walls, the holder including:
      a front ring,
      a back ring,
      a clamp for holding the front ring and back ring, and
      each ring including an annular support for contacting the substrate adjacent a peripheral edge of the substrate, the front ring adapted to contact the front surface and the back ring adapted to contact the back surface of the substrate, and
   a mechanical device for moving the front and back rings radially, the device being driven by pneumatics, hydraulics or a motor.

2. The apparatus as set forth in claim 1 wherein the front ring comprises an annular front support for contacting the substrate at its peripheral edge.

3. The apparatus as set forth in claim 2 wherein the back ring comprises an annular back support for contacting the substrate at its peripheral edge.

4. The apparatus as set forth in claim 1 wherein the back ring comprises an annular back support for contacting the substrate at its peripheral edge.

5. The apparatus as set forth in claim 1 wherein the chamber walls are transparent to allow heating light to pass into the processing chamber.

6. The apparatus as set forth in claim 5 wherein the heater is disposed exterior to the processing chamber.

7. The apparatus as set forth in claim 6 wherein the heater is a first heater, the first heater being disposed above the one or more the chamber walls, the apparatus composing a second heater, the second heater being disposed below the one or more chamber walls.

8. The apparatus as set forth in claim 1 comprising a temperature sensor mounted in the processing chamber configured to monitor the temperature of the substrate holder or semiconductor substrate.

9. An apparatus for stressing a semiconductor substrate, the substrate having a front surface, a back surface and a peripheral edge, the apparatus comprising:
   a chamber,
   a heater for heating the chamber,
   a substrate holder mounted in the chamber, the holder including:
      a front ring,
      a back ring,
      a clamp for holding the front ring and back ring, and
      each ring including an annular support for contacting the substrate adjacent a peripheral edge of the substrate, the front ring adapted to contact the front surface and the back ring adapted to contact the back surface of the substrate; a mechanical device for moving the front and back rings radially, the device being driven by pneumatics, hydraulics or a motor; and
   a temperature sensor mounted in the chamber configured to monitor the temperature of the substrate holder or semiconductor substrate.

10. The apparatus as set forth in claim 9 wherein the temperature sensor is a pyrometer that receives infrared radiation emitted by the holder or substrate.

* * * * *